US008889533B2

(12) United States Patent
Sasaki et al.

(10) Patent No.: US 8,889,533 B2
(45) Date of Patent: Nov. 18, 2014

(54) METHOD OF MANUFACTURING SEMICONDUCTOR DEVICE, METHOD OF MANUFACTURING SUBSTRATE AND SUBSTRATE PROCESSING APPARATUS

(75) Inventors: Takafumi Sasaki, Toyama (JP); Yoshinori Imai, Toyama (JP); Koei Kuribayashi, Toyama (JP); Sadao Nakashima, Toyama (JP)

(73) Assignee: Hitachi Kokusai Electric Inc., Tokyo (JP)

(*) Notice: Subject to any disclaimer, the term of this patent is extended or adjusted under 35 U.S.C. 154(b) by 13 days.

(21) Appl. No.: 13/580,933

(22) PCT Filed: Feb. 22, 2011

(86) PCT No.: PCT/JP2011/053844
§ 371 (c)(1),
(2), (4) Date: Aug. 23, 2012

(87) PCT Pub. No.: WO2011/105370
PCT Pub. Date: Sep. 1, 2011

(65) Prior Publication Data
US 2012/0315767 A1  Dec. 13, 2012

(30) Foreign Application Priority Data
Feb. 26, 2010  (JP) ................ 2010-041574

(51) Int. Cl.
H01L 21/20 (2006.01)
H01L 21/36 (2006.01)
C23C 16/455 (2006.01)
C23C 16/32 (2006.01)
H01L 21/02 (2006.01)

(52) U.S. Cl.
CPC ......... *C23C 16/45578* (2013.01); *C23C 16/325* (2013.01); *H01L 21/02529* (2013.01);

(Continued)

(58) Field of Classification Search
USPC ............... 257/77, E21.054, E21.065, E21.17, 257/E21.182, E21.603; 438/478, 503, 758, 438/931
See application file for complete search history.

(56) References Cited

U.S. PATENT DOCUMENTS

| 2006/0060145 A1* | 3/2006 | Van Den Berg et al. ...... 118/728 |
| 2006/0283389 A1 | 12/2006 | Valente et al. |
| 2009/0087964 A1 | 4/2009 | Maeda et al. |

FOREIGN PATENT DOCUMENTS

| JP | 64-081311 A | 3/1989 |
| JP | 2006-196807 A | 7/2006 |

(Continued)

OTHER PUBLICATIONS

Hajime Okumura et al., "SiC Handotai no Kiso to Oyo", Section 4 Homo-epitaxial growth technology of SiC, 4.1.3 Control of the electric conductivity, ED Research Japan, p. 26 to 27, May 2, 2008.

*Primary Examiner* — Asok K Sarkar
(74) *Attorney, Agent, or Firm* — Volpe and Koenig, P.C.

(57) ABSTRACT

A method of manufacturing a semiconductor device by using a substrate processing apparatus comprises a reaction chamber configured to process a plurality of substrates stacked at predetermined intervals, wherein a first gas flow from a first gas supply inlet and a second gas flow from a second gas supply inlet are crossed with each other before these gas flows reach the substrates. The method of manufacturing a semiconductor device comprises: loading the plurality of substrates into the reaction chamber; supplying a silicon-containing gas and a chlorine-containing gas from the first gas supply inlet into the reaction chamber; supplying a carbon-containing gas and a reducing gas from the second gas supply inlet into the reaction chamber and supplying a dopant-containing gas into the reaction chamber from the first gas supply inlet or the second gas supply inlet; and unloading the substrates from the reaction chamber.

16 Claims, 25 Drawing Sheets

(52) U.S. Cl.
CPC ..... *H01L 21/02532* (2013.01); *H01L 21/02573* (2013.01); *H01L 21/0262* (2013.01); *Y10S 438/931* (2013.01)
USPC 438/503; 257/77; 257/E21.054; 257/E21.065; 257/E21.17; 257/E21.182; 257/E21.603; 438/478; 438/758; 438/931

(56) References Cited

FOREIGN PATENT DOCUMENTS

| | | |
|---|---|---|
| JP | 2006-527157 A | 11/2006 |
| WO | 2007/108401 A1 | 9/2007 |

* cited by examiner

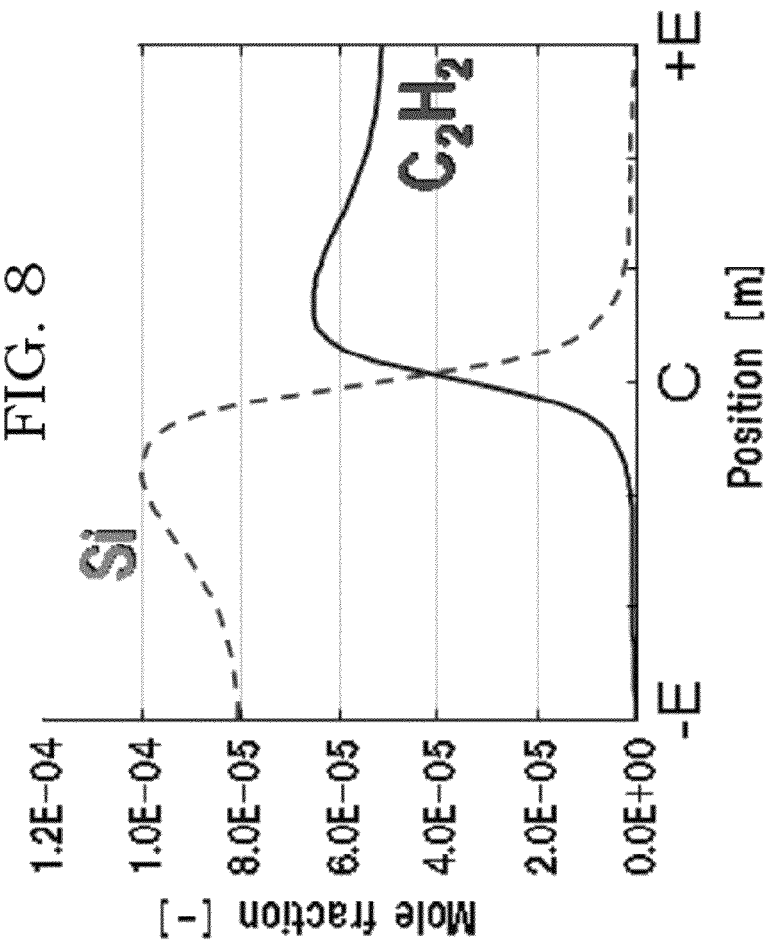

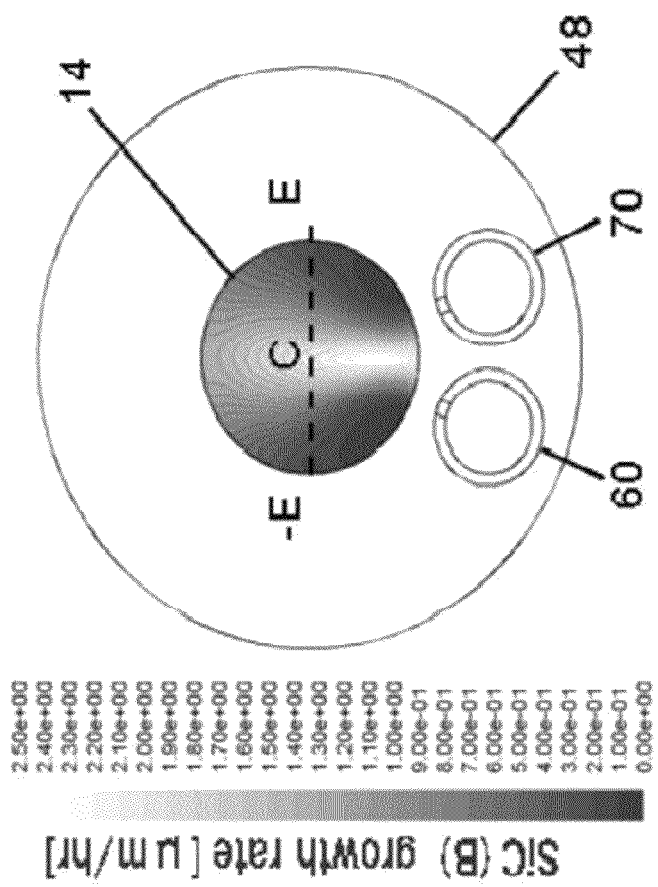

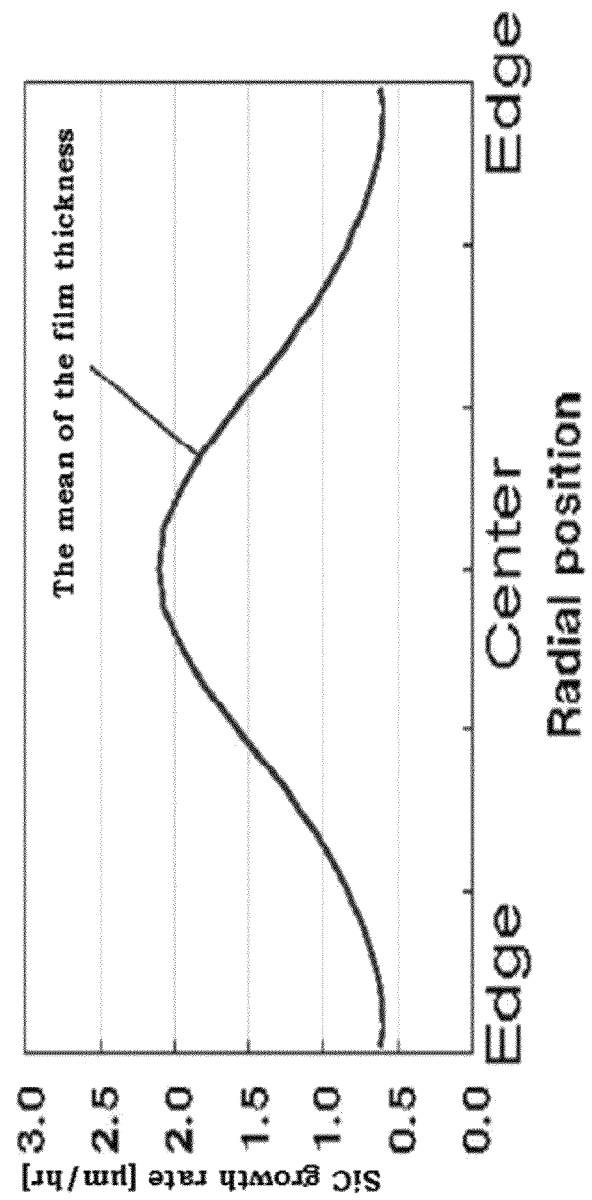

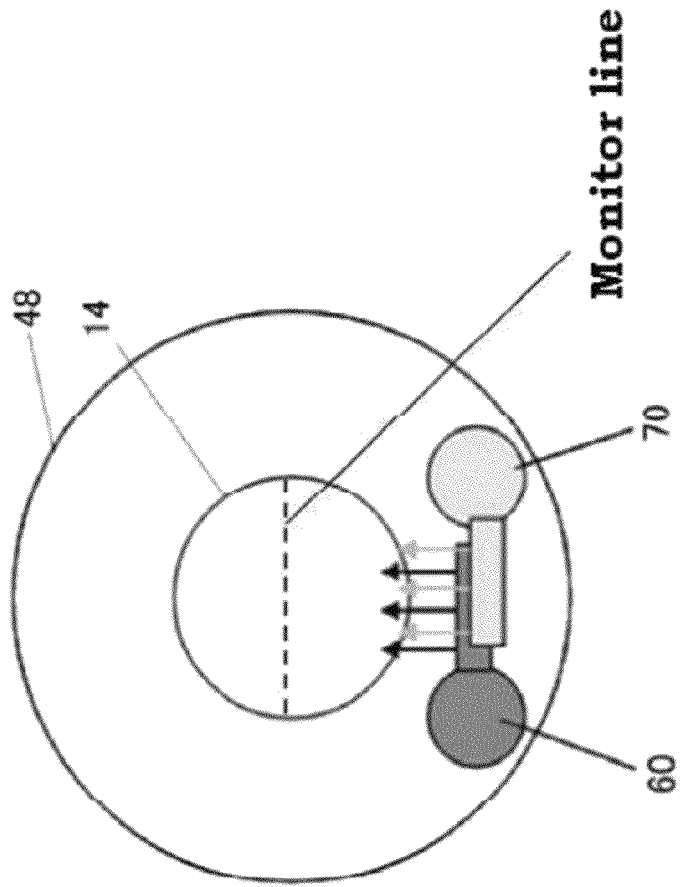

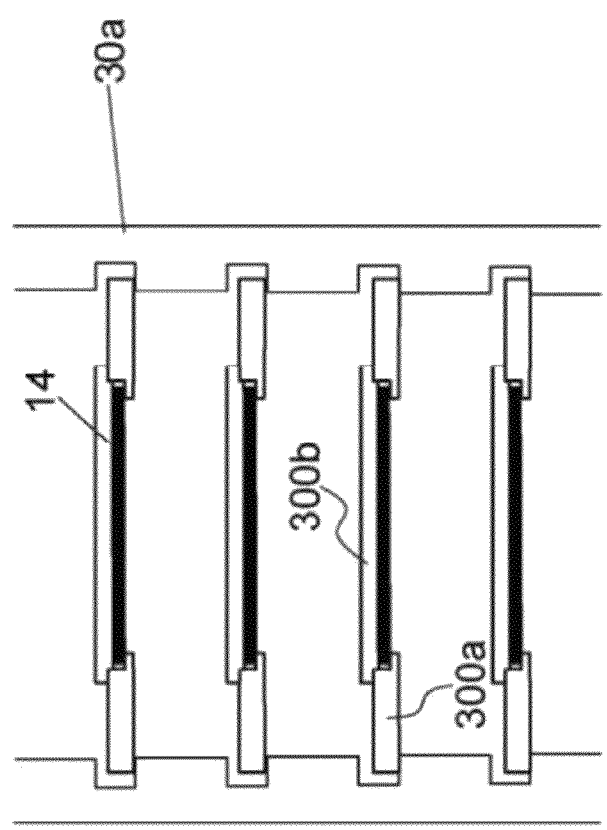

METHOD OF MANUFACTURING SEMICONDUCTOR DEVICE, METHOD OF MANUFACTURING SUBSTRATE AND SUBSTRATE PROCESSING APPARATUS

TECHNICAL FIELD

The present invention relates to a substrate processing apparatus, a method of manufacturing a semiconductor device, and a method of manufacturing a substrate, which include a process of treating a substrate. More particular, the present invention relates to a substrate processing apparatus, a method of manufacturing a semiconductor device, and a method of manufacturing a substrate, which include a process of forming a silicon carbide (hereinafter referred to SiC) epitaxial film on a substrate.

SiC attracts attention as a material particularly for elements of a power device. However, it is known that it is difficult to make a crystalline substrate or device by using SiC as compared with the case of using silicon (hereinafter referred to as Si).

In a SiC film forming apparatus of the related art, a plurality of substrates are disposed on a plane of a plate-shaped susceptor, then formed epitaxial growth film on a substrate under the condition of heating a substrate from 1,500 degrees Celsius to 1,800 degrees Celsius and supplying a source gas to use for forming a film from one spot in a reaction chamber.

Patent Document 1 discloses a vacuum film forming apparatus and a thin film forming method, in which a susceptor is disposed in a manner such that a substrate holding surface of the susceptor faces downward so as to solve problems, such as adhesion of matters deposited from a source gas to a surface facing the susceptor, and unstable epitaxial growth of SiC caused by a convection flow of a source gas.

BACKGROUND ART

Patent Document 1
Japanese Patent Application Laid-Open Publication No. 2006-196807

DISCLOSURE OF THE INVENTION

Problem to be Solved by the Invention

However, there are several problems in the related art. For example, in the case where a plurality of substrates are processed or substrates having a large diameter are processed as shown in FIG. 18, a susceptor having a large size and a reaction chamber having a large floor area are necessary. In addition, since a source gas is supplied into the reaction chamber through one spot, the concentration of the gas is not uniform throughout the reaction chamber, and thus the thickness of films formed on the substrates are not uniform. Furthermore, since SiC epitaxial films are grown under the high temperature like the range from 1500.degrees Celsius to 1800.degrees. Celsius, it is difficult to control the temperature of wafer surfaces or to dope uniformly to a silicon carbide film.

An object of the present invention is to provide a method of manufacturing a semiconductor device, a method of manufacturing a substrate and a substrate processing apparatus for forming SiC films containing dopant uniformly on a substrate.

Means to Solve the Problem

According to an aspect of the present invention, there is provided a method of manufacturing a semiconductor device by using a substrate processing apparatus comprising a reaction chamber configured to process a plurality of substrates stacked at predetermined intervals, a first gas supply nozzle having one or more first gas supply inlets in the reaction chamber and a second gas supply nozzle having one or more second gas supply inlets in the reaction chamber, wherein a first gas flow from the first gas supply inlets and a second gas flow from the second gas supply inlets are crossed with each other before these gas flows reach the substrates, the method comprising:

loading the plurality of substrates into the reaction chamber;

forming a silicon carbide film containing dopant on the substrate, wherein the step of forming a silicon carbide film containing dopant on the substrate is comprised of supplying at least a silicon-containing gas and a chlorine-containing gas, or at least a gas containing silicon atoms and chlorine atoms from the first gas supply inlet into the reaction chamber, supplying at least a carbon-containing gas and a reducing gas from the second gas supply inlet into the reaction chamber and supplying a dopant-containing gas from the first gas supply inlet or the second gas supply inlet into the reaction chamber; and unloading the substrates from the reaction chamber.

According to another aspect of the present invention, there is provided a substrate processing apparatus, comprising:

a reaction chamber configured to process a plurality of substrates stacked at predetermined intervals;

a first gas supply system configured to supply at least a silicon-containing gas and a chlorine containing gas, or at least a gas containing silicon atoms and chlorine atoms into the reaction chamber;

a second gas supply system configured to supply at least a carbon-containing gas and a reducing gas into the reaction chamber;

a third gas supply system configured to supply at least a dopant-containing gas into the reaction chamber;

a first gas supply nozzle having one or more first gas supply inlets for flowing gases to a space where a plurality of substrates are stacked, wherein the first gas supply nozzle is installed to connect to the first gas supply system or connect to the first and the third gas supply system;

a second gas supply nozzle having one or more second gas supply inlets for flowing gases to a space where a plurality of substrates are stacked, wherein the second gas supply nozzle is installed to connect to the second gas supply system or connect to the second and the third gas supply system; and a controller, wherein the controller is configured to control:

the first gas supply system to supply at least a silicon-containing gas and a chlorine-containing gas, or at least a gas containing silicon atoms and chlorine atoms into the reaction chamber through the first gas supply inlet, the second gas supply system to supply at least a carbon-containing gas and a reducing gas into the reaction chamber through the second gas supply inlet, the third gas supply system to supply at least a dopant-containing gas into the reaction chamber from the first or second gas supply inlet, so as to form a silicon carbide film containing dopant on the substrate.

wherein the first gas supply inlets and the second gas supply inlets are arranged so as to a first gas flow from the first gas supply inlets and a second gas flow from the second gas supply inlets are crossed with each other before these gas flows reach the substrates:

According to another aspect of the present invention, there is provided a method of manufacturing a substrate by using a substrate processing apparatus comprising a reaction chamber configured to process a plurality of substrates stacked at predetermined intervals, a first gas supply nozzle having one or more first gas supply inlets in the reaction chamber and a second gas supply nozzle having one or more second gas supply inlets in the reaction chamber, wherein a first gas flow from the first gas supply inlets and a second gas flow from the second gas supply inlets are crossed with each other before these gas flows reach the substrates, comprising:

loading the plurality of substrates into the reaction chamber;

forming a silicon carbide film containing dopant on the substrate, wherein the step of forming a silicon carbide film containing dopant on the substrate is comprised of supplying at least a silicon-containing gas and a chlorine-containing gas, or at least a gas containing silicon atoms and chlorine atoms from the first gas supply inlet into the reaction chamber, supplying at least a carbon-containing gas and a reducing gas from the second gas supply inlet into the reaction chamber and furthermore, supplying a dopant-containing gas into the reaction chamber from the first gas supply inlet or the second gas supply inlet; and unloading the substrates from the reaction chamber.

Advantage of the Invention

According to the present invention, there is provided the substrate processing apparatus capable of a silicon carbide film containing dopant uniformly on the substrate.

BRIEF DESCRIPTION OF THE DRAWINGS

FIG. 8 is a distribution map of the concentration of the silicon gas and ethylene gas, detected at the monitor line, supplying reactant gases in a process furnace according to the first embodiment of the present invention.

FIG. 9A is a distribution map of the film thickness on the substrate, wherein the film was formed without the rotation of the substrate in a process furnace according to the first embodiment of the present invention.

FIG. 9B is a distribution map of the film thickness on the substrate, detected at the monitor line, formed under the rotation of the substrate in a process furnace according to the first embodiment of the present invention.

FIG. 19A is a cross-sectional view illustrating a process furnace installing gas supply nozzles having a divergence pipe with the first or second gas supply inlets according to the forth embodiment of the present invention.

FIG. 19C is a schematic view illustrating a configuration of supporting the boat using wafer holders.

DESCRIPTION OF THE PREFERRED EMBODIMENTS

A First Embodiment

Figure 1:
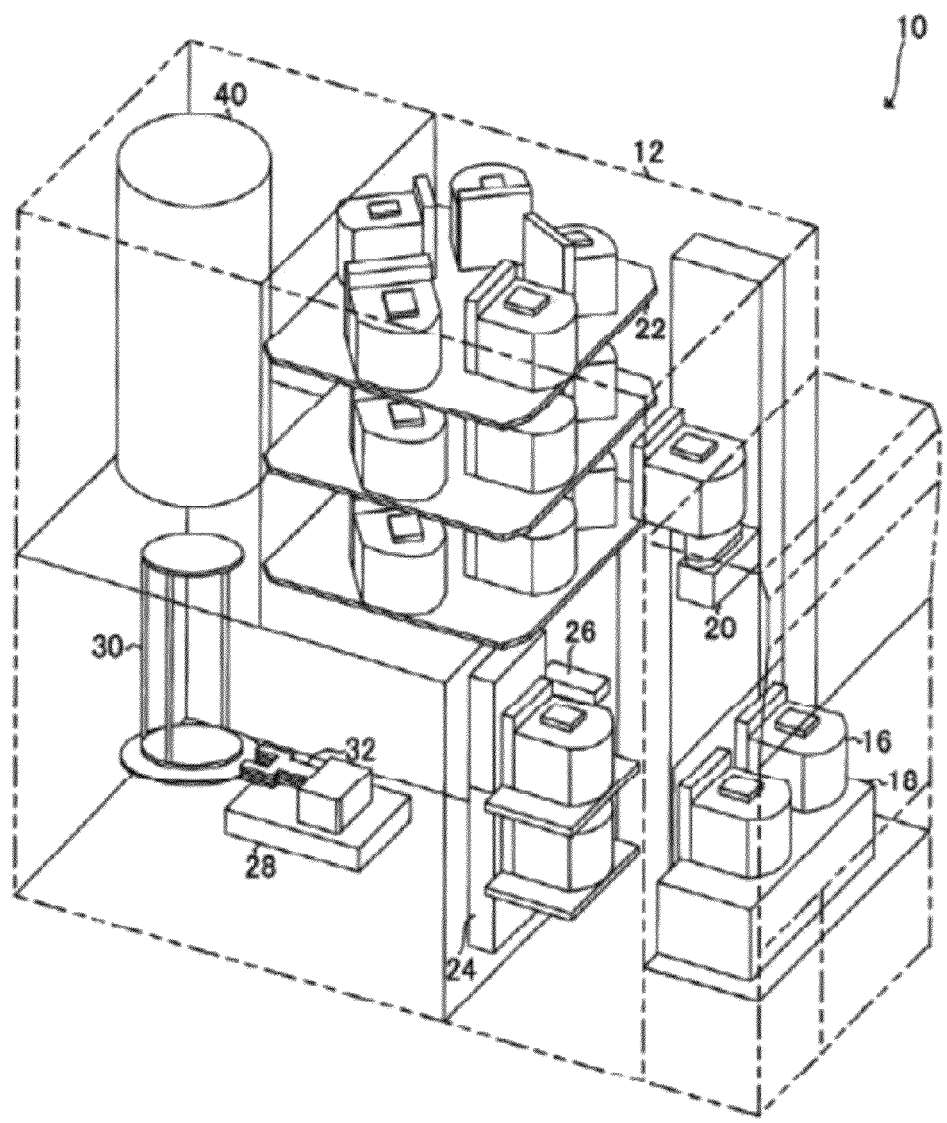
FIG. 1 is a perspective view illustrating a semiconductor manufacturing apparatus 10 according to a first embodiment of the present invention.

A first embodiment of the present invention will be described hereinafter with reference to the attached drawings. FIG. 1 is a perspective view illustrating an example of a semiconductor manufacturing apparatus 10 configured to form a silicon carbide epitaxial film according to a first embodiment of the present invention. A semiconductor manufacturing apparatus 10 being a substrate processing apparatus is a batch type vertical heat treatment apparatus and includes a case 12 in which main parts are disposed. In the semiconductor manufacturing apparatus 10, FOUPs (Front Opening Unified Pods, hereinafter referred to as pods) 16, which are substrate containers configured to accommodate substrates such as wafers 14 (refer to FIG. 2) made of silicon (Si) or silicon carbide (SiC), are used as wafer carriers.

At the front side of the case 12, a pod stage 18 is disposed, and pods 16 are carried to the pod stage 18. For example, twenty five wafers 14 are accommodated in each pod 16, and the pod 16 is set on the pod stage 18 in a state where a cap of the pod 16 is closed.

At a front inner side of the case 12 facing the pod stage 18, a pod carrying device 20 is disposed. Furthermore, in the vicinity of the pod carrying device 20, a pod storage shelf 22, a pod opener 24, and a substrate counter 26 are disposed. The pod storage shelf 22 is disposed above the pod opener 24 and is configured such that a plurality of pods 16 can be placed and held on the pod storage shelf 22. The substrate counter 26 is disposed close to the pod opener 24, and the pod carrying device 20 carries a pod 16 among the pod stage 18, the pod storage shelf 22, and the pod opener 24. The pod opener 24 is used to open a cap of a pod 16, and after the cap of the pod 16 is opened, the substrate counter 26 is used to count the number of wafers 14 disposed in the pod 16.

In the case 12, a substrate transfer machine 28 and a boat 30 being a substrate holding tool are disposed. The substrate transfer machine 28 includes an arm (tweezers) 32 and is configured to be vertically moved and horizontally rotated by a driving unit (not shown). The arm 32 can pick up wafers 14 (for example, five wafers 14), and by operating the arm 32, wafers 14 can be carried between a pod 16 placed on the pod opener 24 and the boat 30.

The boat 30 is made of a heat-resistant material such as carbon graphite or SiC and is configured to hold a plurality of vertically stacked wafers 14 in a manner such that the wafers 14 are horizontally oriented and vertically arranged with the centers of the wafers 14 being aligned with each other. In addition, at the lower part of the boat 30, a boat insulating part 34 is disposed as a circular disk shaped insulating member made of a heat-resistant material such as quartz or SiC, so as to prevent heat transfer from a heating target object 48 (described later) to the lower side of a process furnace 40 (refer to FIG. 2).

At the rear upper part in the case 12, the process furnace 40 is disposed. The boat 30 in which a plurality of wafers 14 are held is loaded into the process furnace 40, and a heat treatment is performed.

Next, with reference to FIG. 2 and FIG. 3, an explanation will be given on the process furnace 40 of the semiconductor manufacturing apparatus 10 configured to form a SiC epitaxial film. A first gas supply nozzle 60 having a first gas supply inlet 68 through which at least a gas containing Si (silicon) atoms and a gas containing Cl (chlorine) atoms are supplied; a second gas supply nozzle 70 having a second gas supply inlet 72 through which at least a gas containing C (carbon), Hydrogen gas for example as a reducing gas and a doping gas containing type-n dopant for example are supplied; and a first gas exhaust outlet 90 are shown as representative examples. In addition, a third gas supply inlet 360 for supplying a inert gas into a space between a reaction tube 42 and an insulator 54, which are configured as a reaction chamber; and a second gas exhaust outlet 390 are shown.

The process furnace 40 includes a reaction tube 42 that forms a cylindrical reaction chamber 44. The reaction tube 42 is made of a heat-resistant material such as quartz or SiC and has a cylindrical shape with a closed top side and an opened bottom side. The reaction chamber 44 is formed in the hollow part of the reaction tube 42 and is configured to accommodate vertically stacked substrates such as wafers 14 made of a material such as Si or SiC in a state where the wafers 14 are horizontally oriented and vertically arranged in the boat 30 with the centers of the wafers 14 being aligned with each other.

At the lower side of the reaction tube 42, a manifold 36 is installed concentrically with the reaction tube 42. The manifold 36 is made of a material such as stainless steel and has a cylindrical shape with opened top and bottom sides. The manifold 36 is installed to support the reaction tube 42.

In addition, between the manifold 36 and the reaction tube 42, an O-ring (not shown) is installed as a seal member. The manifold 36 is supported by a holder (not shown) so that the reaction tube 42 can be vertically fixed. The reaction tube 42 and the manifold 36 constitute a reaction vessel.

The process furnace 40 includes the heating target object 48 configured to be heated, and an induction coil 50 as a magnetic field generating unit. The heating target object 48 is disposed in the reaction chamber 44 and is configured to be heated by a magnetic field generated by the induction coil 50 installed outside the reaction tube 42. As heat is generated from the heating target object 48, the inside of the reaction chamber 44 is heated.

Near the heating target object 48, a temperature sensor (not shown) is installed as a temperature detector configured to detect the inside temperature of the reaction chamber 44. The induction coil 50 and the temperature sensor are electrically connected to a temperature control unit 52, and the temperature control unit 52 is configured to adjust power to the induction coil 50 based on temperature information detected by the temperature sensor so as to obtain desired temperature distribution in the reaction chamber 44 at a predetermined time (refer to FIG. 4).

Preferably, among the first and second gas supply nozzles 10 and 70 and the first exhaust outlet 90 in the reaction chamber 44, vertically extending structures 400 having an arc-shaped cross sectional shape may be installed between the heating target object 48 and wafers 14 to fill the space between the heating target object 48 and the wafers. For example, as shown in FIG. 3, the structures 400 may be installed at opposite positions so that gases supplied through the first and second gas supply nozzles 60 and 70 may not flow around the wafers 14 along the inner wall of the heating target object 48. Preferably, the structures 400 may be made of an insulating material or carbon graphite for resisting heat and preventing generation of particles.

In addition, according to this embodiment, there is provided a method of forming a silicon carbide epitaxial film containing type-n dopant on a wafer 14 as a substrate by supplying gases contributing to forming a film respectively into a heating target object 48 by using a first gas supply nozzle and a second gas supply nozzle, being lengthened along the arrangement region of the substrates. But the configuration of a first gas supply nozzle and a second gas supply nozzle is not limited to this embodiment, there may be formed a silicon carbide epitaxial film containing type-n dopant on a wafer 14 as a substrate, supplying gases contributing to forming a film respectively into a heating target object 48 by using a first gas supply nozzle and a second gas supply nozzle, having its first inlet or second inlet disposed the outside of the region where the substrates are arranged.

Between the heating target object 48 and the reaction tube 42, an insulator 54 is installed, which is made of a material that is hardly induction-heated, such as carbon felt. Owing to the insulator 54, heat transfer from the heating target object 48 to the reaction tube 42 or the outside of the reaction tube 42 can be suppressed.

In addition, at the outside of the induction coil 50, an outer insulating wall having a structure such as a water cooling structure is installed in a manner such that the outer insulating wall surrounds the reaction chamber 44 so as to prevent heat transfer from the inside of the reaction chamber 44 to an outside area. In addition, at the outside of the outer insulating wall, a magnetic field seal 58 is installed to prevent leakage of a magnetic field generated by the induction coil 50 to an outside area.

Figure 2:
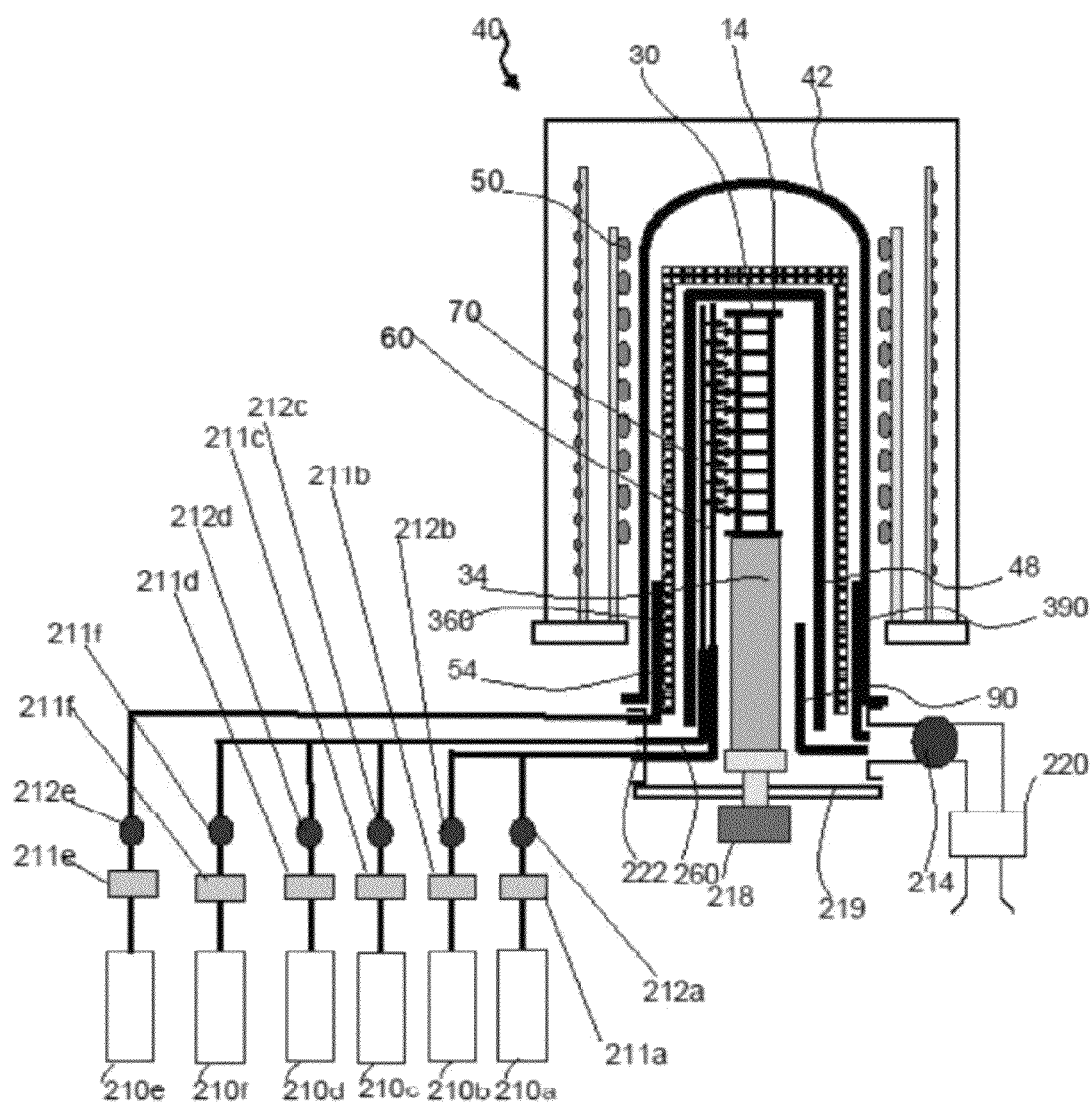
FIG. 2 is a side sectional view illustrating a semiconductor manufacturing apparatus 10 according to the first embodiment of the present invention.

As shown in FIG. 2, between the heating target object 48 and the wafers 14, at least a first gas supply inlet 68 formed at the first gas supply nozzle 60 is disposed to supply at least a silicon-containing gas and a chlorine-containing gas, at least a second gas supply inlet 72 formed at the second gas supply nozzle 70 is disposed at the different position of the first gas supply nozzle 60 to supply at least a carbon-containing gas, hydrogen gas for example as a reducing gas and a dopant-containing gas, for example a type-n dopant-containing gas, and the first exhaust outlet 90 is disposed. Furthermore, between the reaction tube 42 and the insulator 54, the third gas supply inlet 360 and the second exhaust outlet 390 are disposed. These configurations will be described in detail hereinafter.

The first gas supply inlet 68 supplying a monosilane (SiH4) gas e.g. as a silicon-containing gas and a hydrogen chloride (HCl) gas e.g. as a chlorine-containing gas through the first gas supply nozzle 60 is made of a material such as carbon graphite and is disposed in the heating target object 48. The first gas supply nozzle 60 is installed through the manifold 36. The first gas supply nozzle 60 may be provided in plurality.

The first gas supply nozzle 60 is connected to a first gas line 222. The first gas line 222 is connected to a silane gas source 210a and a hydrogen chloride gas source 210b respectively through flow controllers (flow rate control units) such as mass flow controllers (hereinafter referred to as MFCs) 211a and 211b, and valves 212a and 212b.

Owing to this structure, the flow rates, concentrations, and partial pressures of gases such as a silane gas or a hydrogen chloride gas can be controlled respectively in the reaction chamber 44. The valves 212a, 212b and the MFCs 211a, 211b are electrically connected to a gas flow rate control unit 78, so that the supply flow rates of the gases can be individually controlled to predetermined levels at predetermined times (refer to FIG. 4). A first gas supply system is constituted by the silane gas source 210a, the hydrogen chloride gas source 210b, the valves 212a, 212b, the MFCs 211a, 211b, the first gas line 222, the first gas supply nozzle 60, and the at least a first gas supply inlet 68 disposed at the first gas supply nozzle 60.

In the above embodiment, a hydrogen chloride (HCl) gas is mentioned as an example of a chlorine-containing gas. In addition, a chlorine (Cl2) gas may be used instead of the hydrogen chloride (HCl) gas.

In addition, for film formation contribution gases explained by the statements above, it may supply a rare gas or a hydrogen-containing gas as a carrier gas. A rare gas may be a helium (He) gas, a neon (Ne) gas, an argon (Ar) gas, a krypton (Kr) gas or a xenon (Xe) gas. A hydrogen gas is exemplified as a hydrogen-containing gas.

Preferably it may supply a rare gas as a carrier gas. Because if supplying a hydrogen gas as a hydrogen-containing gas as a carrier gas, it may deposit silicon film in a gas supply nozzle as silicon-containing gas may disintegrate under the reduction effect of the hydrogen gas. It may become a cause of clogging a gas supply nozzle or a gas supply inlet and occurrence of particles.

More preferably, it is good to supply an argon gas as a carrier gas. Because the argon gas is cheaper than other rare gases such as the helium gas, it may reduce the running cost when operating a substrate processing apparatus for forming a silicon carbide epitaxial layer.

A silicon-containing gas and a chlorine-containing gas are supplied into a reaction chamber in this description. In addition, supplying a gas containing silicon atoms and chlorine atoms, for example, a tetrachlorosilane (SiCl4) gas, a trichlorosilane (SiHCl3) gas and a dichlorosilane (SiH2Cl2) gas is preferable. More preferably, supplying a tetrachlorosilane gas may be effective to restrict forming a film in a gas supply nozzle and to restrict consumption of the gases and can supply it in a reaction chamber.

The second gas supply inlet 72 is made of a material such as carbon graphite and is disposed in the heating target object 48, and the second gas supply nozzle 70 is installed through the manifold. The second gas supply inlet 72 is configured to supply at least a carbon-containing gas such as a propane (C3H8) and a reducing gas such as a hydrogen-containing gas, for example a hydrogen (H2) gas into the reaction chamber 44 through the second gas supply nozzle 70. The second gas supply nozzle 70 may be provided in plurality.

The second gas supply nozzle 70 is connected to a second gas line 260. For supplying a carbon-containing gas such as a propane gas, the second gas line 260 is connected to a propane gas source 210d through a flow rate control unit such as an MFC 211c and a valve 212c. For supplying a reducing gas such as hydrogen gas, the gas line 260 is also connected to a hydrogen gas source 210d through a flow rate control unit such as an MFC 211d and a valve 212d.

Owing to this structure, the flow rates, concentrations, and partial pressures of gases such as a propane gas and a hydrogen gas can be controlled in the reaction chamber 44. The valves 212c and 212d and the MFCs 211c and 211d are electrically connected to the gas flow rate control unit 78, so that the supply flow rates of the gases can be controlled to predetermined levels at predetermined times (refer to FIG. 4). A second gas supply system is constituted by the propane gas source 210c, the hydrogen gas source 210d, the valves 212c and 212d, the MFCs 211c and 211d, the second gas line 260, the second gas supply nozzle 70, and the second gas supply inlet 72.

In the above description, a propane gas is mentioned as an example of a carbon-containing gas. In addition, an ethylene (C2H4) gas or an acetylene (C2H2) gas may be used as a carbon-containing gas.

In addition, in the above description, a hydrogen gas is mentioned as an example of a reducing gas. In addition, a hydrogen-containing gas may be used as a reducing gas.

In this embodiment, a silicon-containing gas is supplied through the first gas supply nozzle 60 and a hydrogen gas as a reducing gas is supplied through the second gas supply nozzle. In the case of installing gas supply nozzles in a reaction chamber 44 to improve the uniformity of the films on the wafers 14 like this embodiment, supplying a silicon-containing gas with a reducing gas by using a same nozzle may promote the decomposition of a silicon-containing gas and the deposition of silicon films on an inner surface of the gas supply nozzle. In this case, the consumption of the silicon-containing gas may occur at the upper stream of gases. On the contrary to this, by supplying a silicon-containing gas and a reducing gas separately, the deposition of silicon films on an inner surface of the gas supply nozzle and the consumption of the silicon-containing gas may be prevented.

In addition, a carbon-containing gas is supplying through the second gas supply nozzle so as to separate from a silicon-containing gas in this embodiment. This configuration may prevent the deposition of silicon carbide films on an inner surface of the gas supply nozzle, clogging gas supply inlets and generating particles or other pollutants caused by the detachment of formed films.

In the case of preventing the deposition of films enough by supplying a silicon-containing gas and a reducing gas separately, it may be preferable that supplying a silicon-containing gas and supplying a carbon-containing gas may use a same gas nozzle. This configuration can form films on the wafer 14 uniformly because it may be possible to mix a silicon-containing gas and a carbon-containing gas beforehand.

At least a type-n dopant-containing gas such as a nitrogen (N2) gas for doping at least type-n dopant is supplied to the reaction chamber 44 through the second gas supply nozzle 70.

So, the nitrogen gas source 210f is connected to the second gas line 260 through a MFC 211f as a flow controller (flow rate control unit) and a valve 212f.

Owing to this configuration, the flow rate, concentration, and partial pressures of a nitrogen gas as a type-n dopant-containing gas can be controlled in the reaction chamber 44. The valve 212f and the MFC 211f are electrically connected to a gas flow rate control unit 78, so that the supply flow rate of the gas can be individually controlled to predetermined levels at predetermined times (refer to FIG. 4). For example, a third gas supply system is constituted by the nitrogen gas source 210f, the valve 212f, the MFC 211f, gas line 260, the gas supply nozzle 70, and the at least one first gas supply inlet 72 disposed at the gas supply nozzle 70.

In the above description, a nitrogen (N2) gas is mentioned as an example of a type-n dopant-containing gas. In addition, a nitrogen-containing gas such as an ammonia (NH3) gas or the combination of these gases may be used.

A nitrogen gas is a gas which is inert under the hydrogen atmosphere, therefore a nitrogen gas may be used for forming a silicon carbide film containing type-n dopant, the amount of type-n dopant is approximately from $10^{15}$ cm$^{-3}$ to $10^{18}$ cm$^{-3}$.

On the other hand, an ammonia gas is an example of a nitrogen-containing gas which is easy to decompose in a vapor phase. Therefore, the quantity of dopant in a silicon carbide film may be controllable by using such an ammonia gas or a mixed gas including an ammonia gas. For example, nitrogen gas mixed an ammonia gas may be preferable for controlling the amount of dopant.

According to this embodiment, there is provided a method of forming a silicon carbide epitaxial film containing type-n dopant on a wafer 14 as a substrate by supplying a type-n dopant-containing gas.

In addition, in the case of forming a silicon carbide film containing type-p dopant, supplying a silicon-containing gas, a chlorine-containing gas and a type-p dopant-containing gas through the first gas supply nozzle 60 may be preferable. A silicon carbide epitaxial layer containing type-p dopant uniformly may be formed by this manner described in detail later.

In addition, so as to uniformly supply gases to wafers 14 held in the boat 30 which is configured to hold a plurality of vertically stacked wafers 14 in a manner such that the wafers 14 are horizontally oriented and vertically arranged with the centers of the wafers 14 being aligned with each other, the first and second gas supply inlets 68, 72 may be formed to face the respective wafers 14 in substrate arranged regions of the first and second gas supply nozzles 60 and 70. Such a configuration easily allows for controlling a uniformity of film thickness and uniformity of the concentration of dopant in a film formed on wafers 14 respectively.

In the substrate arranged regions of the first and second gas supply nozzles 60 and 70, at least one first gas supply inlet 68 and at least one second gas supply inlet 72 may be provided. In addition, the first gas supply inlets 68 or the second gas supply inlets 70 may be provided for a predetermined number of wafers 14 respectively.

In this embodiment, a silicon containing gas and a chlorine containing gas are supplied through the first gas supply nozzle 60, and a carbon containing gas, a reducing gas and a type-n dopant-containing gas are supplied through the second gas supply nozzle 70. However, for example, multiple gas supply nozzles corresponding to each kind of gases may be installed.

In addition, an inert gas such as an argon (Ar) gas is supplied into the reaction chamber 44 from the third gas supply inlet 360. To adjust the flow rate of the inert gas to a predetermined level, the opening degree of the corresponding MFC 211e is adjusted, and then the valve 212e is opened so that the inert gas can be supplied into the reaction chamber 44 through the third gas line 240 and the third gas supply inlet 360. The argon gas (a rare gas) supplied through the third gas supply inlet 360 as an inert gas is allowed to flow between the insulator 54 and the reaction tube 42 in the reaction chamber 44 and is discharged through the second exhaust outlet 390.

In this embodiment, an argon gas is mentioned as an example of an inert gas, but not limited to this, for example, at least one gas selected from a helium (He) gas, a neon (Ne) gas, a krypton (Kr) gas, or a xenon (Xe) gas e.g. or combination of these gases which are selected more than one gas from these rare gases group.

In this embodiment, a silicon-containing gas, a carbon-containing gas, a reducing gas or a type-n dopant-containing gas is supplied into the heating target object 48 from the first gas supply inlet 68 or the second gas supply inlet 72 respectively. For supplying these gases in the reaction chamber 44 uniformly, supplying these gases with argon gases as carrier gases are preferable.

Figure 3:
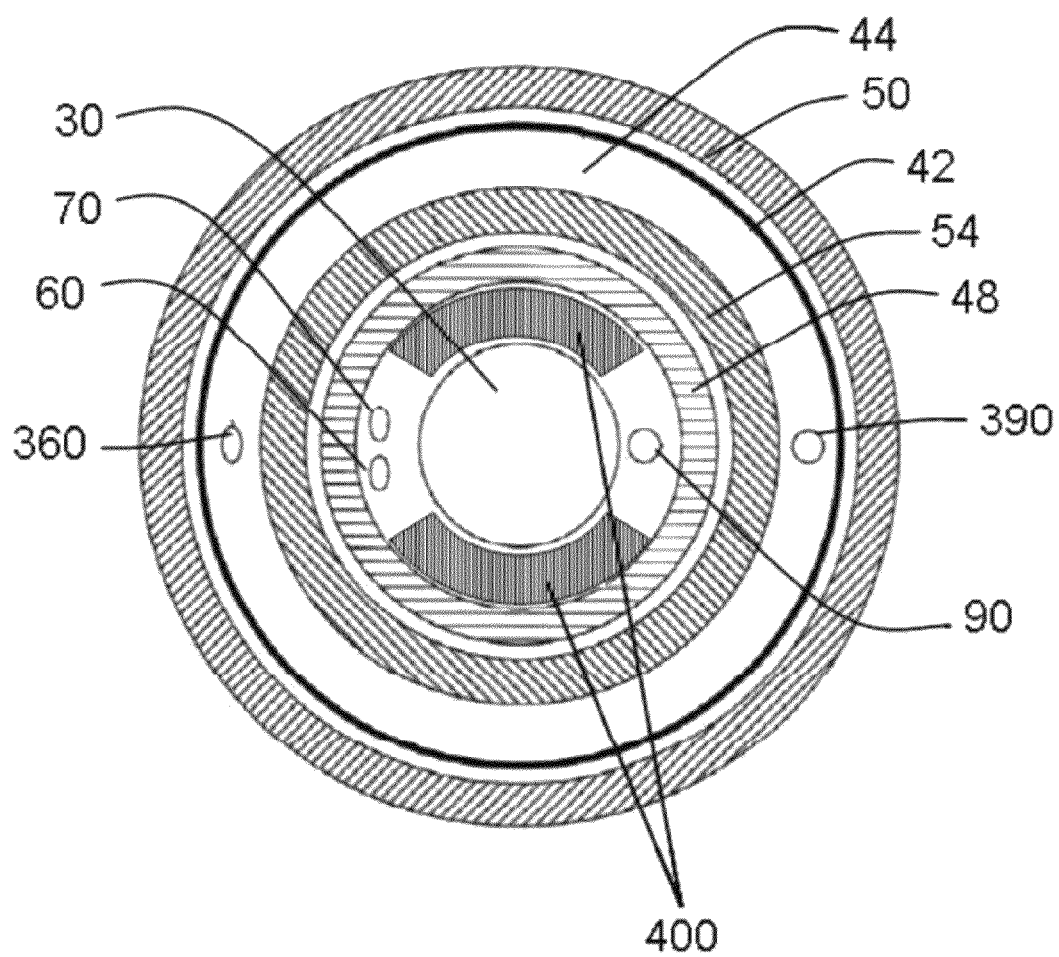
FIG. 3 is a cross-sectional view illustrating a process furnace 40 of the semiconductor manufacturing apparatus 10 according to the first embodiment of the present invention.

In addition, as shown in FIG. 3, the first exhaust outlet 90 is disposed at a position opposite to the first and second gas supply inlets 68, 72, and a gas exhaust pipe 230 connected to the first exhaust outlet 90 is installed through the manifold 36. A vacuum exhaust device 220 such as a vacuum pump is connected to the downstream side of the gas exhaust pipe 230 through a pressure detector (not shown) such as a pressure sensor and a pressure regulator such as an automatic pressure controller (APC) valve 214. The pressure sensor and the APC valve 214 are electrically connected to a pressure control unit 98, and the pressure control unit 98 is configured to adjust the opening degree of the APC valve 214 based on pressures detected by the pressure sensor for controlling the inside pressure of the process furnace 40 to a predetermined level at a predetermined time (refer to FIG. 4).

In addition, as shown in FIG. 3, the third gas supply inlet 360 is disposed between the reaction tube 42 and the insulator 54 and penetrates the manifold 36. In addition, the second exhaust outlet 390 is disposed between the reaction tube 42 and the insulator 54 at a position opposite to the third gas supply inlet 360 and is connected to the gas exhaust pipe 230. From this third gas supply inlet 360, an argon gas (a rare gas) as an inert gas is supplied so that gases contributing to formation of silicon carbide epitaxial films such as a silicon-containing gas, a carbon-containing gas, a chlorine-containing gas or a mixture thereof may be prevented from permeating between the reaction tube 42 and the insulator 54, and adhesion of unnecessary matters to the inner wall of the reaction tube 42 or the outer wall of the insulator 54 may be prevented.

In addition, an insert gas supplied between the reaction tube 42 and the insulator 54 is exhausted through the second exhaust outlet 390 to the gas exhaust pipe 230, and at the downstream side of the gas exhaust pipe 230, the inert gas is exhausted from the vacuum exhaust device 220 through the APC valve 214. The pressure sensor and the APC valve 214 are electrically connected to a pressure control unit 98, and the pressure control unit 98 is configured to adjust the opening degree of the APC valve 214 based on pressures detected by the pressure sensor for controlling the inside pressure of the process furnace 40 to a predetermined level at a predetermined time (refer to FIG. 4).

Next, the surrounding structures of the process furnace 40 will be described.

Figure 4:
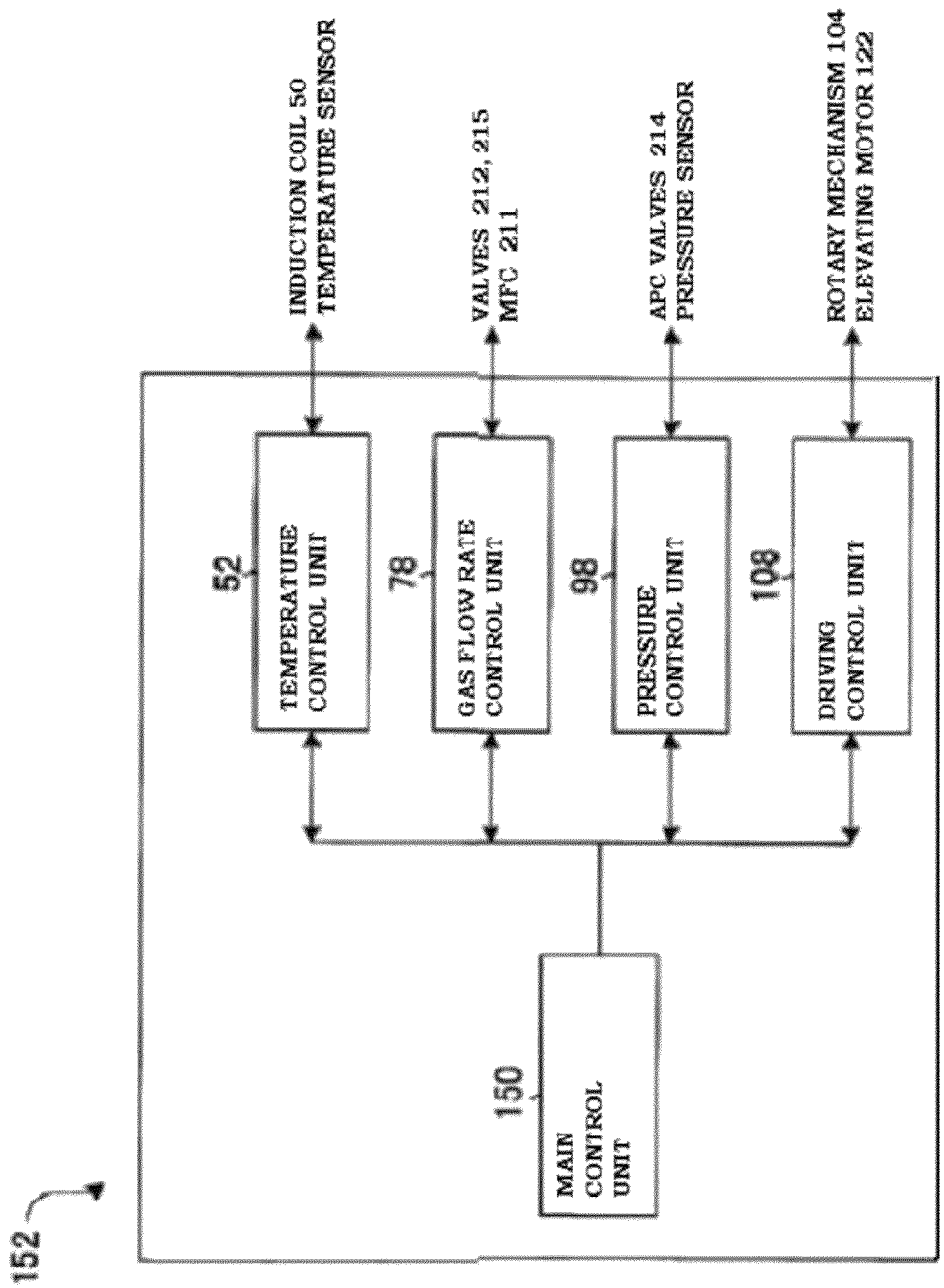
FIG. 4 is a view illustrating a configuration for controlling parts of the semiconductor manufacturing apparatus 10 according to the first embodiment of the present invention.
Figure 5:
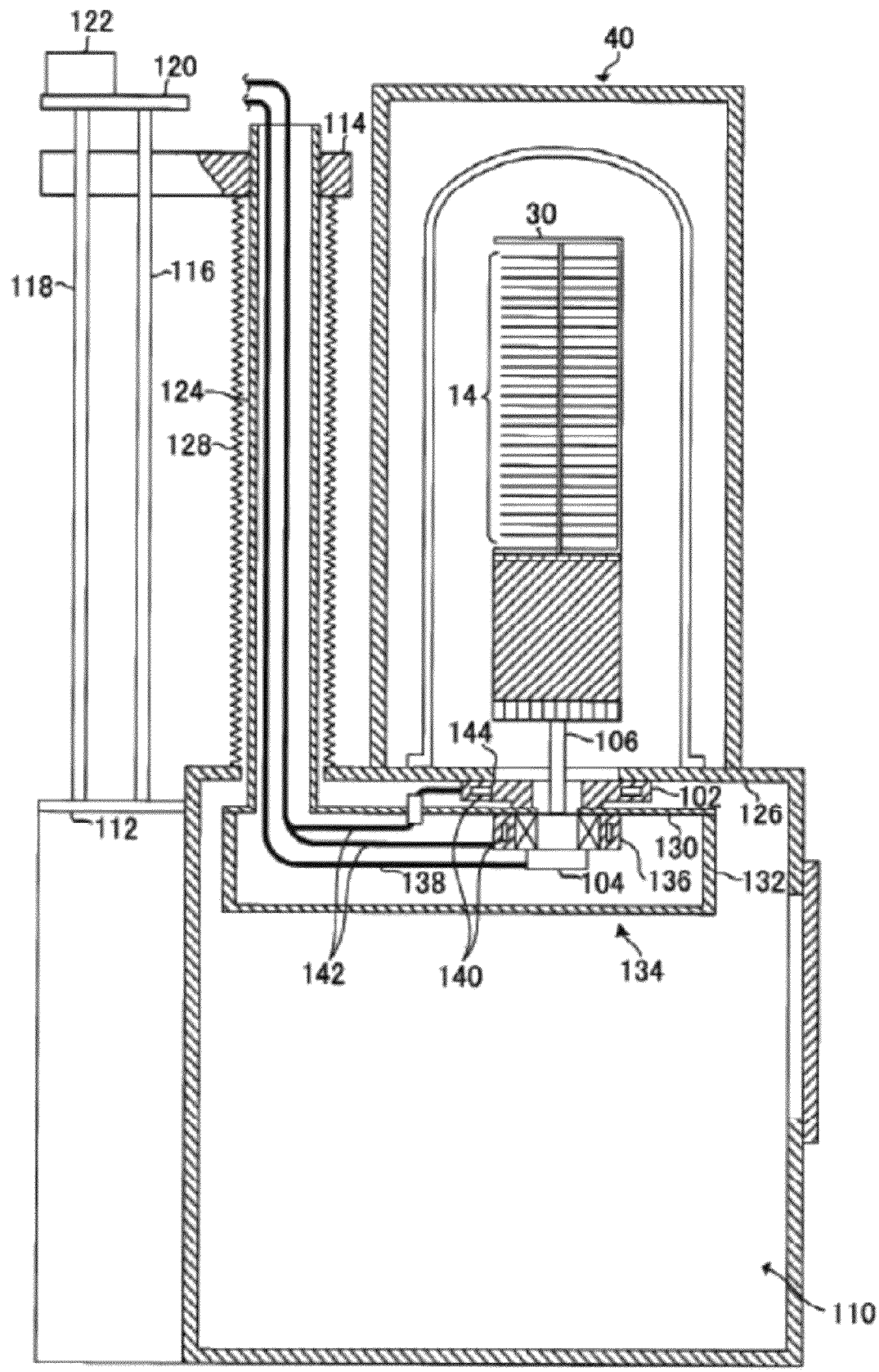
FIG. 5 is a schematic view illustrating a process furnace 40 of the semiconductor manufacturing apparatus 10 and the surrounding structures of the process furnace 40 according to the first embodiment of the present invention.

FIG. 5 is a schematic view illustrating a process furnace 40 of the semiconductor manufacturing apparatus 10 and the surrounding structures of the process furnace according to the first embodiment of the present invention. At the bottom side of the process furnace 40, a seal cap 102 is installed as a furnace port cover to hermetically close the bottom-side opening of the process furnace 40. The seal cap 102 is made of a metal such as stainless steel and has a circular disk shape. On the top surface of the seal cap 102, an O-ring (not shown) is installed as a seal member configured to make contact with the bottom side of the process furnace 40. At the seal cap 102, a rotary mechanism 104 is installed. A rotation shaft 106 of the rotary mechanism 104 is connected to the boat 30 through the seal cap 102 and is configured to rotate wafers 14 by rotating the boat 30. The seal cap 102 is configured to be vertically lifted and lowered by an elevating motor 122 (described later) installed at the outside of the process furnace 40 as an elevating mechanism, so as to load the boat 30 into the process furnace 40 and unload the boat 30 from the process furnace 40. The rotary mechanism 104 and the elevating motor 122 are electrically connected to a driving control unit 108, and thus predetermined operations can be performed at predetermined times under the control of the driving control unit 108 (refer to FIG. 4).

At the outer surface of a loadlock chamber 110 which is a preliminary chamber, a lower base plate 112 is installed. A guide shaft 116 slidably fitted in an elevating table 114, and a ball screw 118 screw-coupled to the elevating table 114 are installed at the lower base plate 112. On the upper ends of the guide shaft 116 and the ball screw 118 erected on the lower base plate 112, an upper base plate 120 is installed. The ball screw 118 is rotated by the elevating motor 122 installed on the upper base plate 120. As the ball screw 118 is rotated, the elevating table 114 is lifted or lowered.

At the elevating table 114, a hollow elevating shaft 124 is installed to be extended from the elevating table 114, and a joint part between the elevating table 114 and the elevating shaft 124 is hermetically sealed. The elevating shaft 124 is configured to be lifted and lowered together with the elevating table 114. The elevating shaft 124 is movably inserted through a top plate 126 of the loadlock chamber 110. A penetration hole of the top plate 126 through which the elevating shaft 124 is movably inserted is sufficiently large so that the elevating shaft 124 does not make contact with the top plate 126 at the penetration hole.

An elevating base plate 130 is horizontally fixed to the lower end of the elevating shaft 124. A driving unit cover 132 is hermetically attached to the bottom surface of the elevating base plate 130 with a seal member such as an O-ring being disposed therebetween. The elevating base plate 130 and the driving unit cover 132 constitute a driving unit accommodation case 134. In this way, the inside of the driving unit accommodation case 134 is isolated from the inside atmosphere of the loadlock chamber 110.

In addition, the rotary mechanism 104 for the boat 30 is installed in the driving unit accommodation case 134, and the periphery of the rotary mechanism 104 is cooled by a cooling mechanism 135.

A power supply cable 138 extends from the upper end of the elevating shaft 124 to the rotary mechanism 104 through the hollow part of the elevating shaft 124, and then the power supply cable 138 is connected to the rotary mechanism 104. In addition, cooling channels 140 are formed in the cooling mechanism 135 and the seal cap 102. Coolant conduits 142 extend from the upper end of the elevating shaft 124 to the cooling channels 140 through the hollow part of the elevating shaft 124, and then the coolant conduits 142 are connected to the cooling channels 140.

By rotating the ball screw 118 using the elevating motor 122, the driving unit accommodation case 134 can be lifted or lowered through the elevating table 114 and the elevating shaft 124.

If the driving unit accommodation case 134 is lifted, a furnace port 144 which is an opening of the process furnace 40 is closed by the seal cap 102 hermetically installed on the elevating base plate 130, and thus a wafer processible state can be made. If the driving unit accommodation case 134 is lowered, the boat 30 is also lowered together with the seal cap 102, and in this state, wafers 14 can be carried to an outside area.

FIG. 4 is a view illustrating a configuration for controlling parts of the semiconductor manufacturing apparatus 10 configured to form a silicon carbide epitaxial film. The temperature control unit 52, the gas flow rate control unit 78, the pressure control unit 98, and the driving control unit 108 constitute a manipulation unit and an input/output unit and are electrically connected to a main control unit 150 that controls the overall operation of the semiconductor manufacturing apparatus 10. The temperature control unit 52, the gas flow rate control unit 78, the pressure control unit 98, and the driving control unit 108 are configured as a controller 152.

In this manner, at least a silicon-containing gas, a chlorine-containing gas, and a type-n dopant-containing gas are supplied through the first gas supply inlet 68. At least a carbon-containing gas and a reducing gas are supplied through the second gas supply inlet 72. Then these supplied gases flow into the first exhaust outlet 90. So, the gases flow parallel to the surfaces of the wafers 14 comprising silicon or a silicon carbides. Then, the entire surfaces of wafers 14 are exposing to the gases effectively and uniformly.

Next, an explanation will be given on a method of forming a silicon carbide film exemplary containing type-n dopant on a substrate such as a silicon carbide wafer 14 by using the above-described semiconductor manufacturing apparatus 10 in one of semiconductor device manufacturing processes. In the following explanation, each part of the semiconductor manufacturing apparatus 10 is controlled by the controller 152.

First, if a pod 16 accommodating a plurality of wafers 14 is set on the pod stage 18, the pod carrying device 20 carries the pod 16 from the pod stage 18 to the pod storage shelf 22 so that the pod storage shelf 22 can be stocked with the pod 16. Next, the pod carrying device 20 carries the pod 16 from the pod storage shelf 22 to the pod opener 24 and sets the pod 16 on the pod opener 24; the pod opener 24 opens a cap of the pod 16; and the substrate counter 26 detects the number of the wafers 14 accommodated in the pod 16.

Next, the substrate transfer machine 28 picks up wafers 14 from the pod 16 placed on the pod opener 24 and transfers the wafers 14 to the boat 30.

After a plurality of wafers 14 are charged into the boat 30, the boat 30 in which the wafers 14 are held is loaded into the reaction chamber 44 (boat loading) as the elevating table 114 and the elevating shaft 124 are lifted by the elevating motor 122. At this time, the bottom side of the manifold 36 is sealed by the seal cap 102 in a state where the O-ring (not shown) being disposed between the manifold 36 and the seal cap 102.

After the boat 30 is loaded, the inside of the reaction chamber 44 is vacuum-evacuated by the vacuum exhaust device 220 to a predetermined pressure (vacuum degree). At this time, the inside pressure of the reaction chamber 44 is measured using the pressure sensor (not shown), and based on the measured pressure, the APC valve 214 communicating with the first exhaust outlet 90 and the second exhaust outlet 390 is feedback-controlled. In addition, the heating target object 48 is heated to increase the temperature of the wafers 14 and the inside of the reaction chamber 44 to a predetermined level. At this time, to obtain predetermined temperature distribution in the reaction chamber 44, power to the induction coil 50 is feedback-controlled based on temperature information detected by the temperature sensor (not shown). Subsequently, the rotary mechanism 104 rotates the boat 30 to rotate the wafers 14 charged in the boat 30.

Next, for a silicon carbide epitaxial growth reaction, a silicon-containing gas and a chlorine-containing gas are supplied through the first gas supply inlet 68 from the gas sources 210a and 210b respectively and a carbon-containing gas, a hydrogen (H2) gas as a reducing gas and a type-n dopant-containing gas are supplied through the second gas supply inlet 72 from the gas sources 210c, 210d, 210f respectively.

In addition, after adjusting the opening degrees of the MFCs 211a and 211b to control the flow rates of a silicon-containing gas and a chlorine containing gas, the valves 212a and 212b are opened to introduce the gases into the reaction chamber 44 through the gas line 222, the first gas supply nozzle 60, and the first gas supply inlet 68.

In addition, after adjusting the opening degrees of the MFCs 211c, 211d and 211f to control the flow rates of a carbon containing gas, a hydrogen (H2) gas as a reducing gas and a type-n dopant-containing gas, the valves 212c, 212d and 212f are opened to introduce the gases into the reaction chamber 44 through the gas line 260, the second gas supply nozzle 70, and the second gas supply inlet 72.

The gases supplied through the first and second gas supply inlets 68, 72 are allowed to flow through the inside of the heating target object 48 provided in the reaction chamber 44, and the gases are discharged through the first exhaust outlet 90 and the gas exhaust pipe 230. When the gases supplied through the first and second gas supply inlets 68, 72 flow through the inside of the reaction chamber 44, the gases make contact with the wafers 14 made of a material such as a silicon carbide so that a silicon carbide epitaxial films containing type-n dopant can be grown on the surfaces of the wafers 14.

In addition, an inert gas such as an argon gas is supplied from the gas supply source 210e. To adjust the flow rate of the inert gas to a predetermined level, the opening degree of the corresponding MFC 211e is adjusted, and then the valve 212e is opened so that the inert gas can be supplied into the reaction chamber 44 through the gas line 240 and the third gas supply inlet 360. The argon gas (rare gas) supplied through the third gas supply inlet 360 as an inert gas is allowed to flow between the insulator 54 and the reaction tube 42 in the reaction chamber 44 and is discharged through the second exhaust outlet 390.

As described above, a silicon-containing gas and a chlorine-containing gas are supplied through the first gas supply nozzle 60. A carbon-containing gas, a hydrogen containing gas as a reducing gas and a type-n dopant-containing gas are supplied through the second gas supply nozzle 70. These gases are supplied from the inlets arranged the same interval as the interval of stacked wafers to the height direction. Such a configuration allows for forming a silicon carbide film containing type-n dopant on the wafer 14 as a substrate comprising silicon carbide (SiC).

Figure 6:
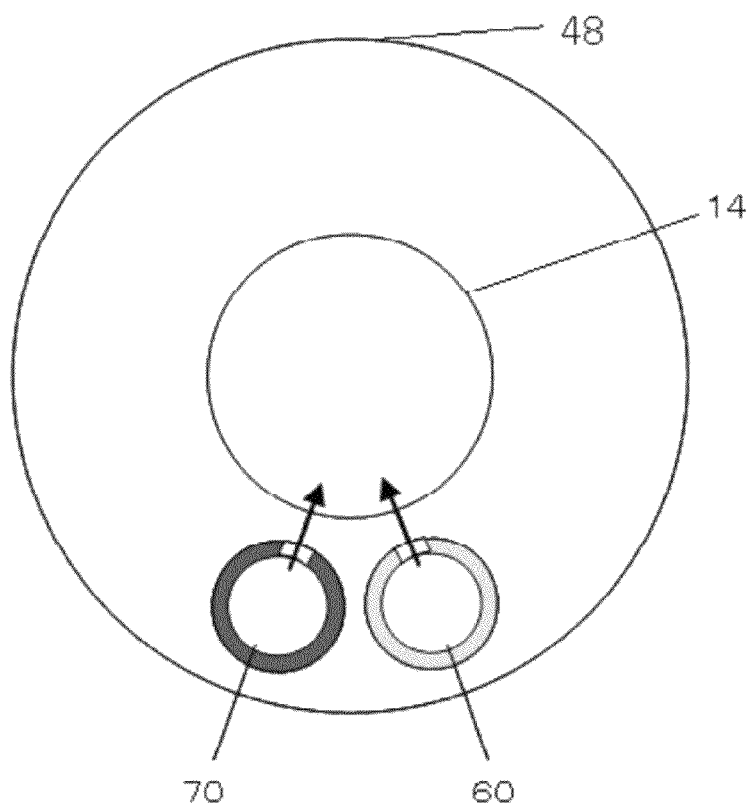
FIG. 6 is a cross-sectional view illustrating a process furnace 40 according to the first embodiment of the present invention.

In addition, as shown in FIG. 6, the gas flow from the first gas supply inlets and the gas flow from the second gas supply inlets are crossed with each other so that mixing the gases may promote.

Figure 7:
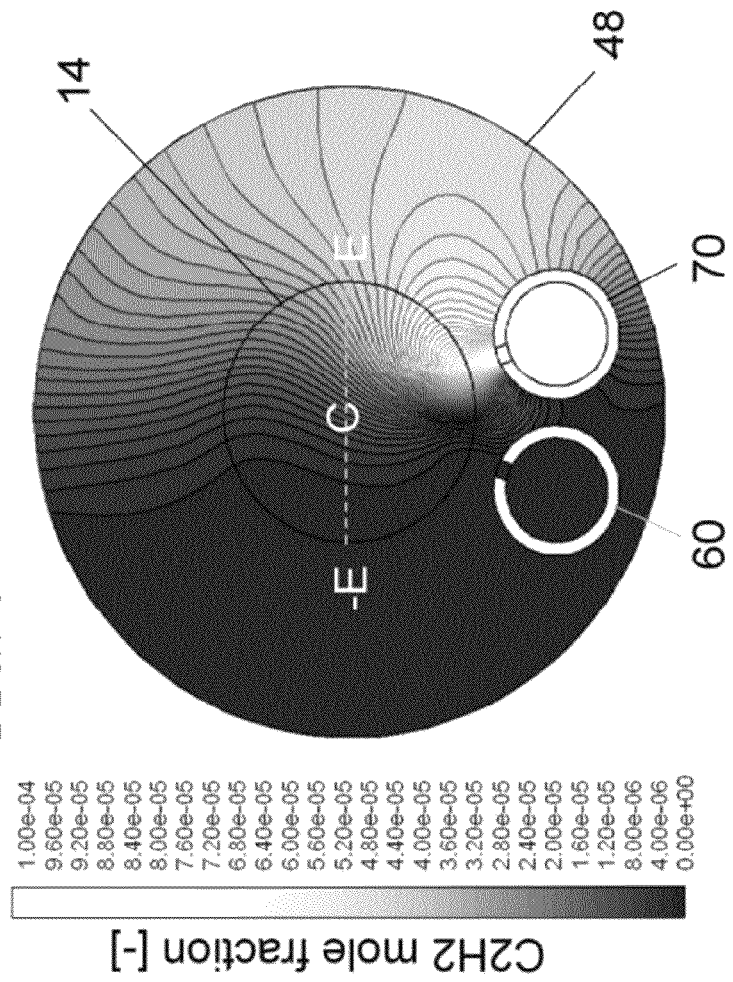
FIG. 7 is a distribution map of the concentration of the ethylene gas in a process furnace according to the first embodiment of the present invention.

FIG. 7 illustrates the mole fractions of an acetylene (C2H2) gas on a wafer 14 under using the configurations of this reaction chamber and supplying a source gas in this embodiment. FIG. 8 illustrates the distributions of a silicon gas concentration and an acetylene gas concentration at the dotted line (monitor line) in FIG. 7.

Referring FIG. 7 and FIG. 8, the gases supplied from the first gas supply inlet and the second gas supply inlet forms desired film on wafer 14 by flowing on a surface of wafer 14. Since the first gases including a silicon-containing gas and a chlorine-containing gas supplied from the first gas supply inlet and the second gases including a carbon-containing gas, a hydrogen gas as a reducing gas and a nitrogen gas as a type-n dopant-containing gas, supplied from the second gas supply inlet may not mix well while they are flowing on a wafer 14, the silicon concentration is high (silicon rich) in the areas located close to the first gas supply nozzle, and the carbon concentration is high (carbon rich) in the areas located close to the second gas supply nozzle.

FIG. 9A is a distribution map of the film thickness on the substrate, wherein the film was formed without the rotation of the substrate in a process furnace according to the first embodiment of the present invention. FIG. 9B is a distribution map of the film thickness on the substrate, detected at the monitor line, formed under the rotation of the substrate in a process furnace according to the first embodiment of the present invention.

As shown in FIG. 9A and FIG. 9B, the deviations of the concentration distribution of the source gases may cause a serious influence on thickness of the formed film. As distribution of the film thickness, the middle area of the wafer 14 becomes the convex form. It becomes the factor to cause a yield loss in the manufacture of the semiconductor devices.

In addition, for example, nitrogen as type-n dopant, or for example, aluminum as type-p dopant is added in a source gas to control electrical resistivity of formed film in a process to form a silicon carbide film.

Physical properties such as the electrical resistivity of a silicon carbide film are controlled by controlling the concentrations of nitrogen as type-n dopant or aluminum as type-p dopant.

However, like mentioned above, when doping type-n or type-p dopant to a silicon carbide film, deviations of concentrations of silicon atoms or carbon atoms on the wafer 14 may affect the concentrations of dopant.

A mechanism when dopant is doped to a silicon carbide film will be explained hereafter.

It is known that dopant in a silicon carbide film are occupying either carbon sites or silicon sites in a silicon carbide film. For example, when nitrogen atoms as type-n dopant are doping, some carbon atoms which may adhere to silicon sites are replaced by the nitrogen atoms. Therefore, nitrogen atoms may occupy some carbon sites in a silicon carbide film. In this way, a silicon carbide film containing type-n dopant may be formed.

For example, when aluminum atoms as type-p dopant are doping, some silicon atoms which may adhere to carbon sites are replaced by the aluminum atoms in a silicon carbide film. Therefore, aluminum atoms may occupy some silicon sites in a silicon carbide film. In this way, a silicon carbide film containing type-p dopant may be formed.

These are called 'site-competition epitaxy'.

In a case of doping nitrogen as type-n dopant, the C/Si ratio as a ratio of carbon concentration to silicon concentration in a source gases or on a film may affect the deviation of the occupations of the carbon sites or silicon sites in a silicon carbide film containing type-n dopant.

The areas where C/Si ratios are higher than the other areas in a film, in other words, these areas' concentrations of the carbon are relatively higher than the concentrations of silicon, the densities of nitrogen source materials (e.g. N2 and N atom) in gas may relatively become low.

Then nitrogen occupying the carbon sites in a silicon carbide film may decrease because the probability occupying nitrogen as an adsorption species in the carbon site of silicon carbide film becomes low.

In other word, doping type-n dopant may be hard at the areas where the C/Si ratios are high.

In contrast, when aluminum as type-p dopant are doping, tendency of site-competition may be reversed in comparison with the case of doping type-n dopant.

Figure 17:
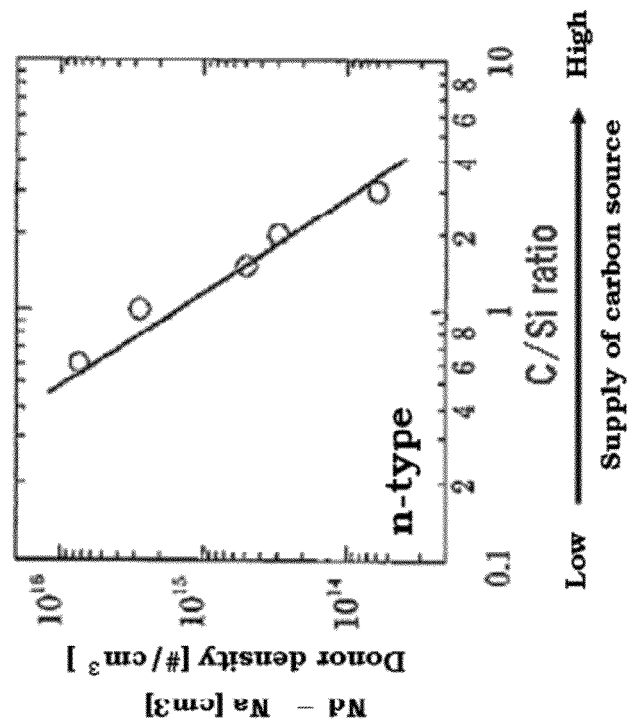
FIG. 17 is a graph illustrating the relationship between the C/Si ratio and the concentration of type-n dopant in a silicon carbide film containing type-n dopant.
Figure 18:
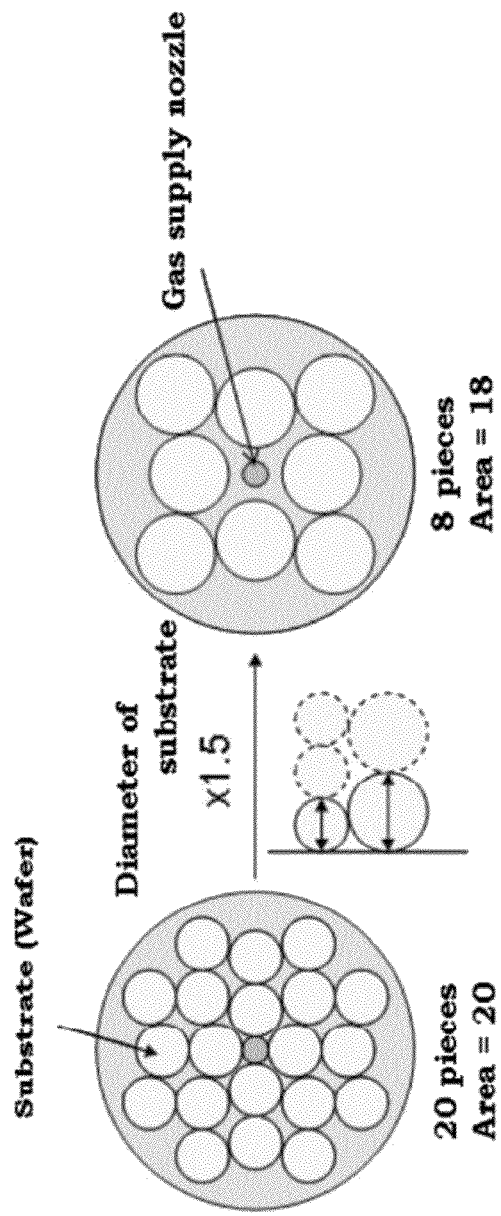
FIG. 18 is a schematic view illustrating a relationship between a pancake type susceptor and substrate positions.

FIG. 17 is a graph illustrating the relationship between the C/Si ratio as a ratio of carbon concentration to silicon concentration in a source gases and the concentration of type-n dopant in a silicon carbide film containing type-n dopant, which are described FIG. 4.5 at page 27 in the textbook entitled 'SiC Handotai no Kiso to Oyo' by Hajime Okumura, Kazutoshi Kojima and Kenji Fukuda, issued by ED Research. By this graph, it is found that when C/Si ratio in a source gas becomes high, doping type-n dopant may be impeded.

Based upon the foregoing, to equalize nitrogen concentrations in silicon carbide film containing type-n dopant on wafer 14, it is desirable that deviation of the C/Si ratios in each area of silicon carbide film should be little.

Then some ideas may be required to supply dopant gases when supplying nitrogen (N2) gas as a type-n dopant-containing gas for forming silicon carbide film containing type-n dopant. In addition, some ideas may also be required to supply dopant gases when supplying a Tri Methyl Aluminum (TMA) gas as a type-p dopant-containing gas for forming a silicon carbide film containing type-p dopant.

Under consideration of the above, the inventors invented the method of supplying a type-n dopant-containing gas or a type-p dopant-containing gas for forming a silicon carbide film containing type-n or type-p dopant.

For example, in the case of forming a silicon carbide film containing type-n dopant, supplying a type-n dopant-containing gas like a nitrogen gas with a carbon-containing gas from the second gas supply nozzle for supplying a carbon-containing gas. It can supply more the nitrogen gas to the areas where C/Si ratios are high, in other words, the carbon concentrations may be relatively higher than other areas on a wafer 14. In this way, it is promoted that carbon-sites are occupied with nitrogen atoms. So the distribution of nitrogen concentrations compared with the areas where C/Si rations are low may became equal.

In this way, the uniformity of concentration distribution of type-n dopant in a silicon carbide film on a wafer 14 can be improved.

On the other hand, in the case of forming a silicon carbide film containing type-p dopant, supplying a type-p dopant-containing gas like a Tri Methyl Aluminum (TMA) gas with a silicon-containing gas from the first gas supply nozzle for supplying silicon containing gas.

Therefore, it may be possible that making the conditions that aluminum concentrations are high by supplying a Tri Methyl Aluminum (TMA) gas intentionally to the areas where C/Si ratios are low on a wafer 14, in other words, the silicon concentrations are relatively higher than other areas. In this way, it is promoted that silicon-sites are occupied with aluminum atoms. So the distribution of type-p dopant concentrations in a type-p silicon carbide film formed on a wafer 14.

After a predetermined time, supply of the gases is terminated, and inert gas is supplied from an inert gas supply source (not shown) to replace the inside atmosphere of the heating target object 48 with the inert gas and adjust the inside pressure of the reaction chamber 44 back to atmospheric pressure.

Thereafter, the seal cap 102 is lowered by the elevating motor 122 to open the bottom side of the manifold 36, and along with this, the processed wafers 14 are unloaded from the reaction tube 42 through the bottom side of the manifold 36 in a state where the processed wafers 14 are held in the boat 30 (boat unloading), and the boat 30 is left at a predetermined position until all the wafers 14 held in the boat 30 are cooled. Next, if the wafers 14 of the boat 30 are cooled to a predetermined temperature, the substrate transfer machine 28 picks up the wafers 14 from the boat 30 and carries the wafers 14 into an empty pod 16 set on the pod opener 24. Thereafter, the pod carrying device 20 carries the pod 16 in which the wafers 14 are accommodated to the pod storage shelf 22 or the pod stage 18. In this way, a series of operations of the semiconductor manufacturing apparatus 10 is completed.

In this way, by restricting epilayer growth in gas supply nozzles and being reacted with a silicon-containing gas, a carbon-containing gas, a chlorine-containing gas, a hydrogen-containing gas as a reduce gas and a dopant-containing gas supplied from gas supply nozzles in the heating target object 48, silicon carbide epilayer growth may be possible under the configurations accommodated vertically stacked substrates such as wafers 14 made of a material such as a silicon carbide e.g. in a state where the wafers 14 are horizontally oriented and vertically arranged with the centers of the wafers 14 being aligned with each other.

In addition, preferably, the first gas supply nozzles 60 and the second gas supply nozzles 70 may be installed so that the first gas supply inlets 68 and the second gas supply inlets 72 may be arranged in a manner such that gases can be ejected through the first and second gas supply inlets 68, 72 towards the centers of respective wafers 14. And the first gas supply nozzles and the second gas supply nozzles may be installed alternately.

In this way, the deviations of supplying gases may prevent, therefore uniformity of film thickness may be further improved.

In addition, although cylindrical gas supply nozzles as the first gas supply nozzle or the second gas supply nozzle are shown in this embodiment, gas supply nozzles having an angled shape such as a polygonal cross-sectional shape may be installed. In this case, preferably, sidewalls of the gas supply nozzles are disposed along the inner wall of the heating target object 48. In this case, since the space between the nozzles and the heating target object 48 can be narrowed, film-forming gases can be prevented from flowing into the space to prevent unnecessary consumption of the gases and generation of particles caused by a film formed by the gases introduced into the space, and thus the gases can be supplied to wafers 14 more efficiently.

Although an argon gas (rare gas) is mentioned as a preferred example of an inert gas, the present invention is not limited thereto. For example, a helium (He) gas, a neon (Ne) gas, a krypton (Kr) gas, or a xenon (Xe) gas may be used instead of an argon gas.

According to this embodiment, at least one of the following effects can be attained.

(1) In case that there are deviations of the silicon carbide ratio in a silicon carbide film, by supplying a dopant-containing gas with a source gas containing the atoms which may be replaced by dopant, uniformity of the dopant concentration in a silicon carbide film can be improved.

(2) In case of forming a silicon carbide film containing type-p dopant, by supplying at least a silicon-containing gas, a chlorine-containing gas and a type-p dopant-containing gas from the first gas supply nozzle into the reaction chamber 44, supplying at least a carbon-containing gas and a reducing gas from the second gas supply nozzle in the reaction chamber 44, uniformity of the type-p dopant concentrations on a wafer surface can be improved.

(3) In case of forming a silicon carbide film containing type-n dopant, by supplying at least a silicon-containing gas and a chlorine-containing gas from the first gas supply nozzle into the reaction chamber 44, supplying at least a carbon-containing gas, a reducing gas and a type-n dopant gas from the second gas supply nozzle in the reaction chamber 44, uniformity of the type-n dopant concentrations on a wafer surface can be improved.

(4) Owing to effect (1) through (3), because of supplying a silicon-containing gas and a carbon-containing gas into the reaction chamber 44 by using another gas supply nozzle respectively, forming a silicon carbide film to the inner wall of the gas supply nozzles can be prevented.

(5) Owing to the effect (4), clogging of the gas supply nozzles 60 and 70 caused by a deposited silicon carbide film can be prevented.

(6) Owing to the effect (4), generation of particles caused by a deposited silicon carbide film can be prevented.

(7) Owing to effect (1) through (3), because of supplying silicon-containing gas and carbon-containing gas in reaction chamber 44 by using another gas nozzle respectively, decompositions of silicon-containing gas in the gas supply nozzles can be prevented.

(8) Owing to effect (7), consumption of silicon-containing gas in the gas supply nozzle can be prevented.

(9) Owing to effect (7), deposition of a silicon film in the inner surface of the silicon-containing gas supply nozzle can be prevented.

(10) Owing to effect (7), generation of particles caused by a deposited silicon carbide film can be prevented.

(11) By the effects mentioned above, silicon carbide epilayer containing dopant can grow for multiple substrates by one process.

A Second Embodiment

Next, a second embodiment of the present invention will be described.

In the first embodiment, by installing the first and second gas supply nozzles 60 and 70, it may be possible that preventing the growth of deposited film in the inner wall of nozzle and growing a silicon carbide film containing dopant uniformly in the reaction chamber.

In the second embodiment, in order to perform a silicon carbide epitaxial film growing process in the reaction chamber 44 more efficiently, the number of the installed nozzles and/or the arrangement of these nozzles are modified.

Figure 10:
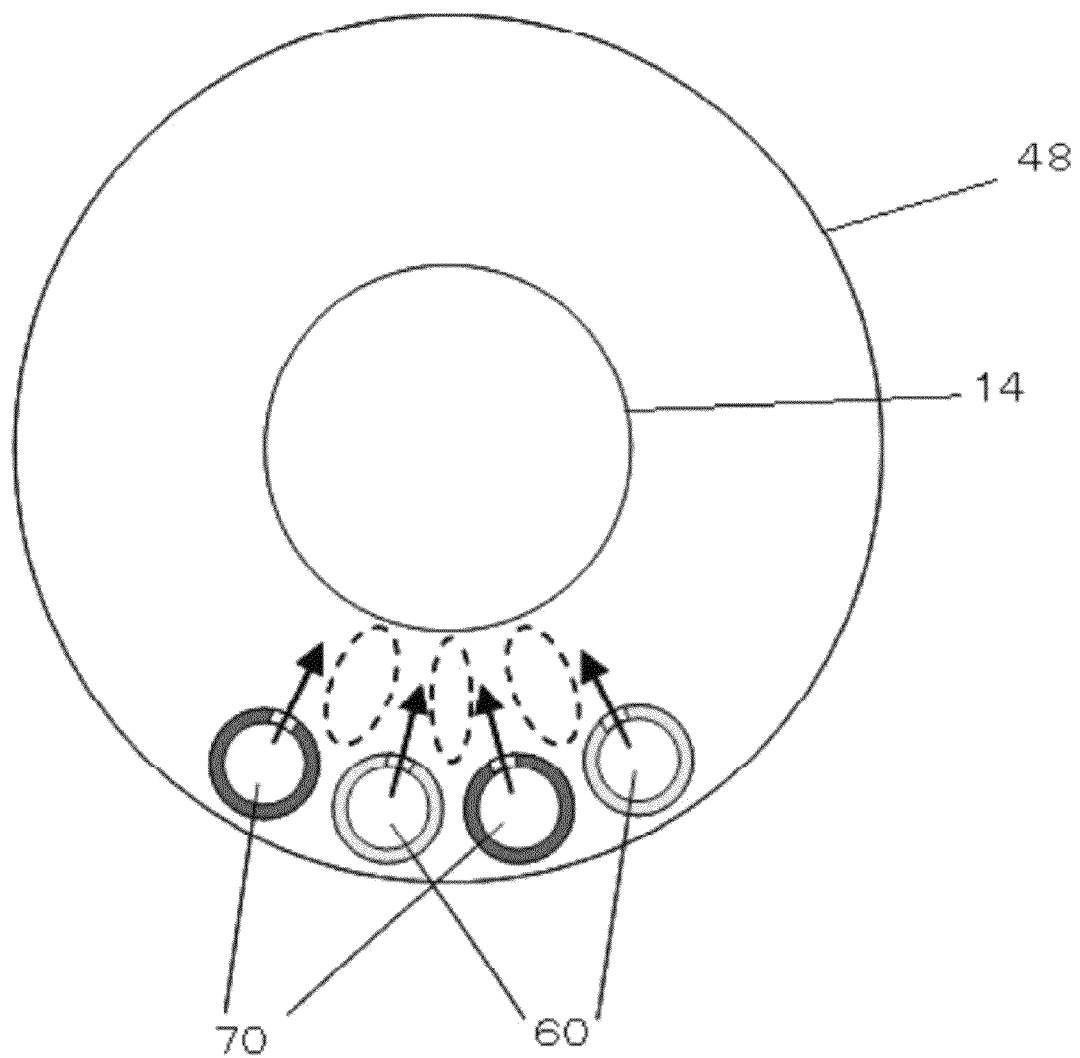
FIG. 10 is a schematic view of computed result of the flow of the gases in a process furnace arranged totally even number of the first gas supply nozzles and the second gas supply nozzles alternately according to the second embodiment of the present invention.
Figure 11:
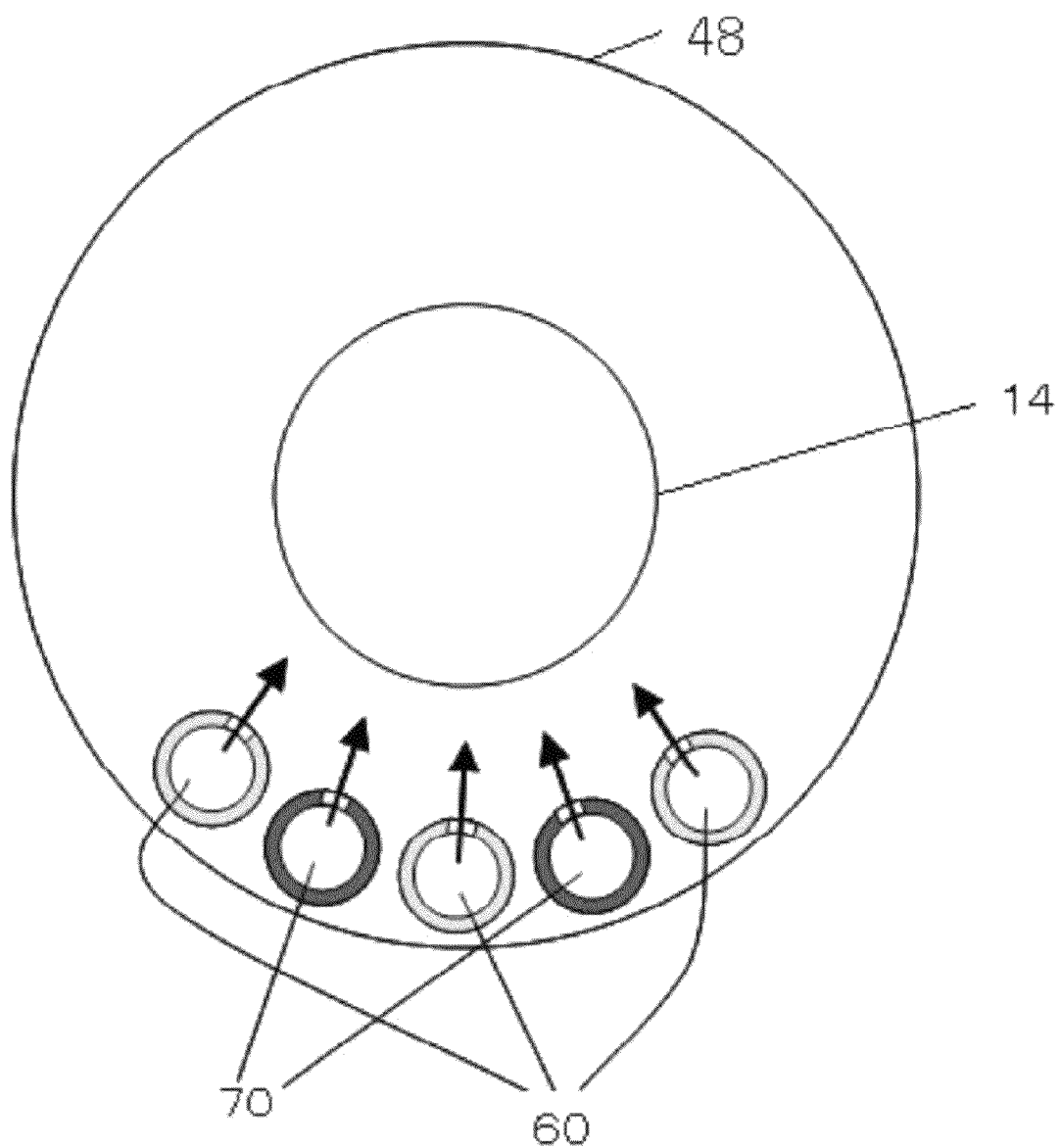
FIG. 11 is a cross-sectional view illustrating a process furnace arranged the second gas supply nozzle in center, totally odd number of the first gas supply nozzles and the second gas supply nozzles according to the second embodiment of the present invention.

FIG. 10 or FIG. 11 are cross-sectional views of the reaction chamber 44 arranged multiple gas supply nozzles surrounding the wafer for improving the uniformity of the dopant levels and doping profiles in a silicon carbide film on a wafer 14. FIG. 10 is a cross-sectional view of the reaction chamber 44 arranged totally even number of the first gas supply nozzles and the second gas supply nozzles alternately. FIG. 11 is a cross-sectional view of the reaction chamber 44 arranged the second gas supply nozzle in center, totally odd number of the first gas supply nozzles and the second gas supply nozzles alternately.

Figure 12:
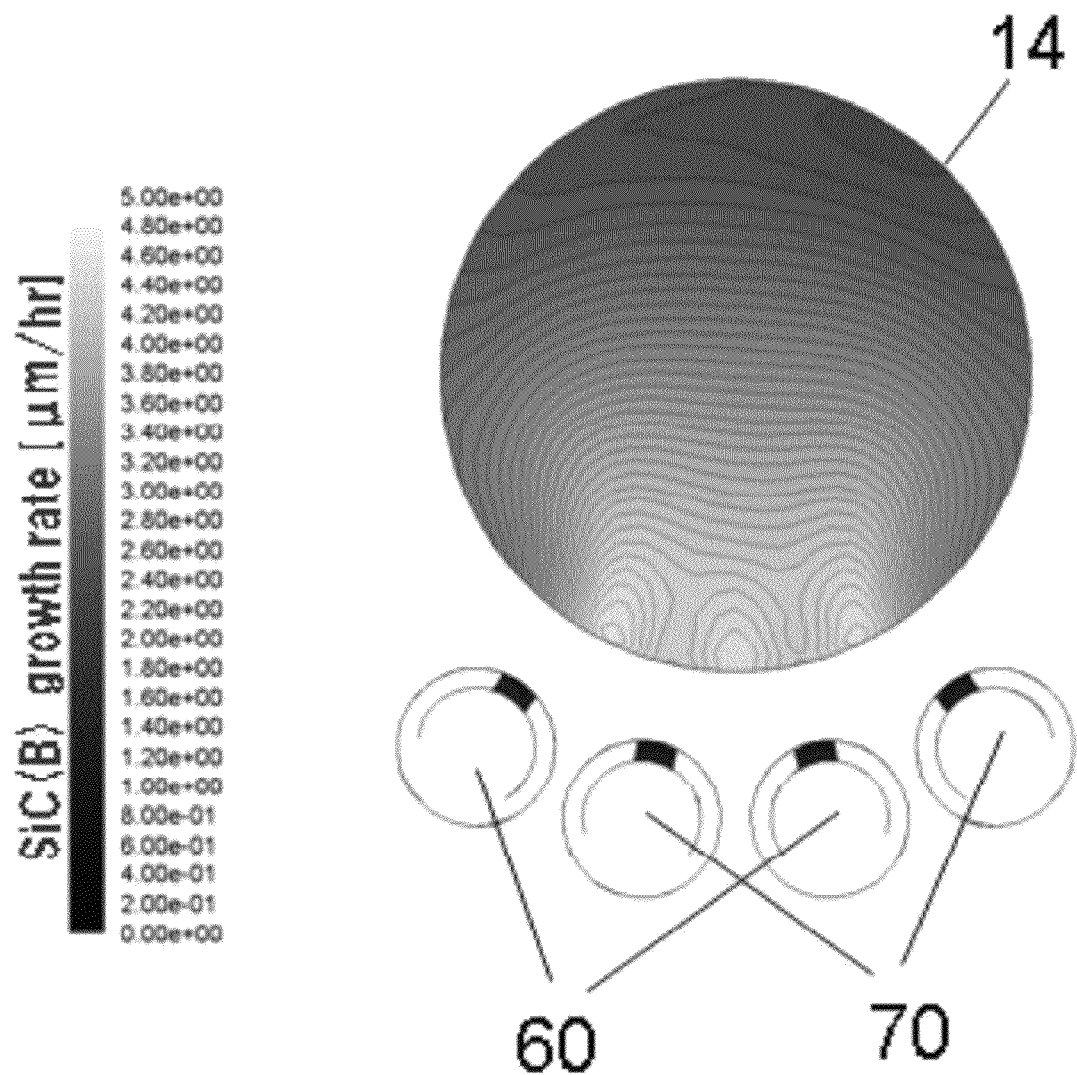
FIG. 12 is a distribution map of the film thickness on the substrate formed in a process furnace arranged totally even number of first gas supply nozzles and the second gas supply nozzles alternately according to the second embodiment of the present invention.

FIG. 12 is a distribution map of the film thickness on the wafer 14. The film was formed in the reaction chamber 44 which cross-sectional view is as shown in FIG. 10.

By installing the multiple first gas supply nozzles and the multiple second gas supply nozzles along the inner wall of the heating target object 48 like this embodiment as shown in FIG. 12, silicon-containing gases supplied from the first gas supply nozzles and carbon-containing gases supplied from the second gas supply nozzles may be efficiently mixed with each other. Thus, uniformity of the film thickness of silicon carbide film may be improved.

As a result, uniformity of the film thickness of a silicon carbide film may be improved. In addition, the deviations of the C/Si ratio in a silicon carbide film become low. Therefore, doping uniformly is easily controllable when forming a silicon carbide film with a dopant-containing gas. So uniformity of the dopant concentrations in a silicon carbide film may be improved.

The first gas supply nozzle 60 may have one or more than first gas supply inlets 68 and the second gas supply nozzle 70 may have one or more than second gas supply inlets 72 respectively, these inlets may be arranged at same intervals as intervals of stacked wafers in the height direction. These configurations may supply gases efficiently to multiple wafers 14, which are horizontally oriented and vertically arranged with the centers of them being aligned with each other. Therefore, uniformity of the film thickness of the silicon carbide film containing dopant may be improved.

In addition, as shown in FIG. 11, it may be preferable that the first and second gas supply nozzles 60 or 70 are multiple nozzles respectively and the second gas supply nozzles are located at the both ends of the arrangement of nozzles. In this case, the reducing gas such as a hydrogen gas supplied from the second gas supply nozzles 70 may flowingly carry a silicon-containing gas, a carbon-containing gas or a dopant-containing gas on wafer 14. Therefore, forming films on wafers 14 may be promoted and forming films to the component except the wafers 14 may be prevented. Because a silicon carbide film is not formed other than wafer 14, this can prevent the occurrence of particles.

According to the second embodiment, at least one of the following effects can be attained in addition to the effects explained in the first embodiment.

(1) By using the reaction chamber installed the multiple first gas supply nozzles or second gas supply nozzles, a silicon-containing gas and a carbon-containing gas can be efficiently mixed with each other.

(2) Owing to the effect (1), as increasing in points to mix with a silicon-containing gas and a carbon-containing gas, uniformity of the film thickness of the silicon carbide film containing dopant can be improved.

(3) Owing to the effect (1), as the distribution of the C/Si ratio in a silicon carbide film becomes uniform, the uniformity of the concentrations of dopant in a silicon carbide film can be improved.

(4) According to the (1), as the second gas supply nozzles are located at the both ends of the arrangement of nozzles when the multiple first gas supply nozzles and the multiple second gas supply nozzles are installed along the inner circumference of the heating target object 48, a silicon-containing gas, a carbon-containing gas or a dopant-containing gas can be supplied efficiently to wafers.

(5) Owing to the effect (4), forming any films on the parts except wafers in the reaction chamber can be prevented.

(6) Owing to the effect (4), generation of particles caused a film formed on the parts except wafers in the reaction chamber can be prevented.

A Third Embodiment

Next, a third embodiment of the present invention will be described.

In the third embodiment, the positions where the first and second gas supply inlets 68, 72 are disposed at the first and second gas supply nozzles 60 and 70 are described so as to efficiently mix the silicon-containing gas supplied from the first gas supply nozzle and the carbon-containing gas supplied from the second gas supply nozzle and supply these gases to the wafers 40.

Figure 13A:
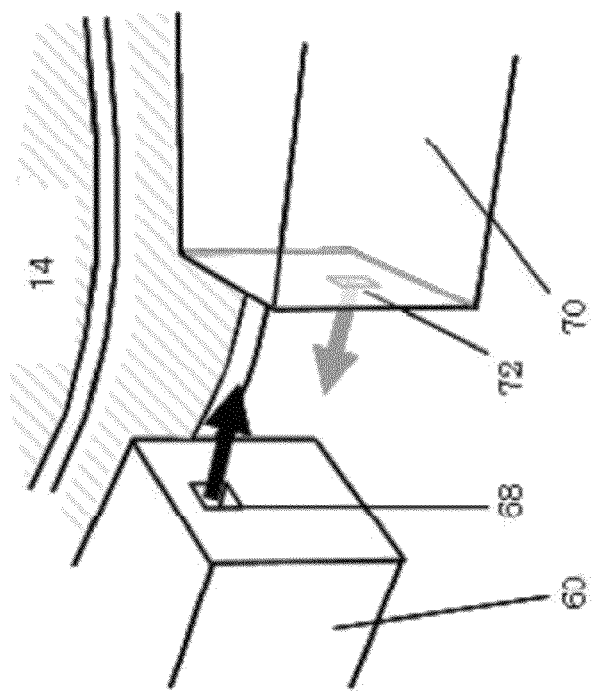
FIG. 13A is a schematic view of a reaction chamber configured the height of the first gas supply inlets are different from the height of the second gas supply inlets so that the first gas supply inlets and the second gas supply inlets to face according to the third embodiment of the present invention.
Figure 13B:
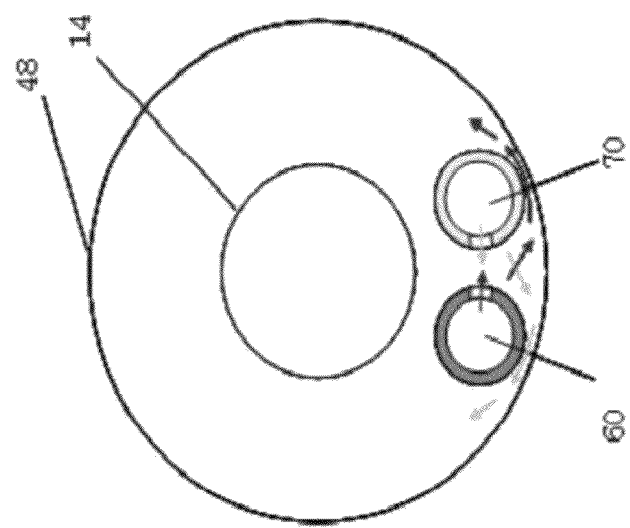
FIG. 13B is a cross-sectional view illustrating a reaction chamber using cylindrical nozzles so that the first gas supply inlets and the second gas supply inlets to face according to the third embodiment of the present invention.
Figure 13C:
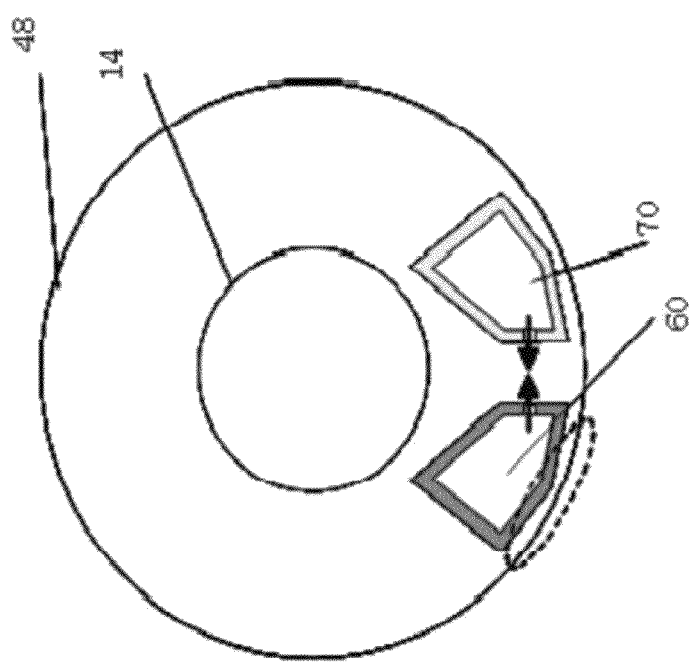
FIG. 13C is a cross-sectional view illustrating a reaction chamber using polygonal nozzles so that the first gas supply inlets and the second gas supply inlets to face according to the third embodiment of the present invention.

FIG. 13A, FIG. 13B and FIG. 13C show the embodiments of the reaction chamber 44 for efficiently mixing a silicon-containing gas supplied from the first gas supply nozzle 60 and a carbon-containing gas supplied from the second gas supply nozzle 70 before supplying these gases to the wafers 14. FIG. 13A is a schematic view of a reaction chamber configured the height of the first gas supply inlets are different from the height of the second gas supply inlets.

FIG. 13B is a cross-sectional view illustrating a reaction chamber using cylindrical nozzles.

FIG. 13C is a cross-sectional view illustrating a reaction chamber using polygonal nozzles.

As shown in FIG. 13A, it is preferable that the height of the first gas supply inlets is different from the height of the second gas supply inlets.

Figure 14A:
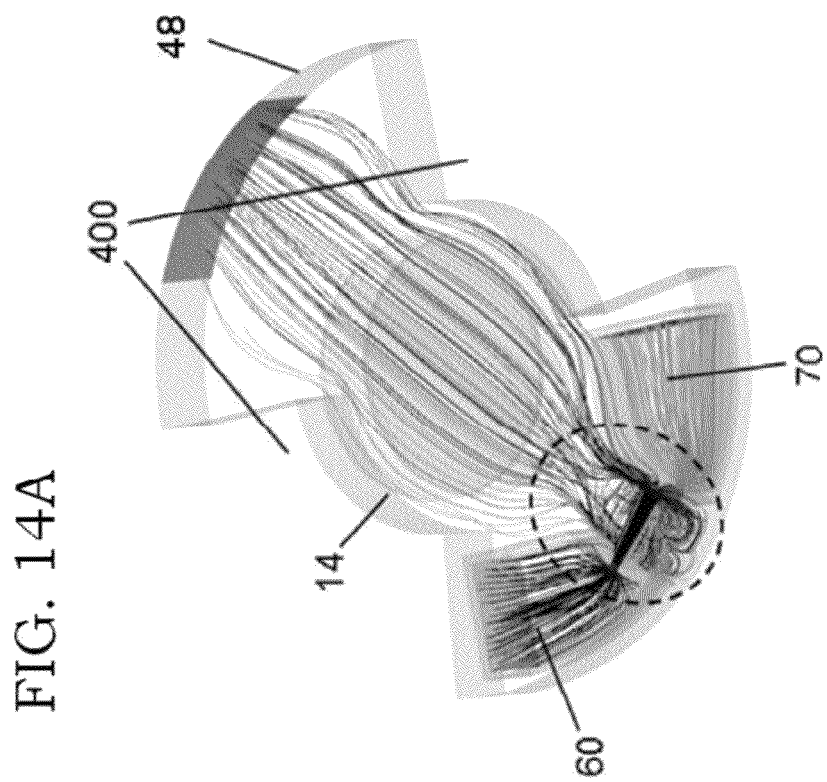
FIG. 14A is a schematic view of computed result of the flow of the gases in a reaction chamber configured the height of the first gas supply inlets are different from the height of the second gas supply inlets so that the first gas supply inlets and the second gas supply inlets to face according to the third embodiment of the present invention.
Figure 14B:
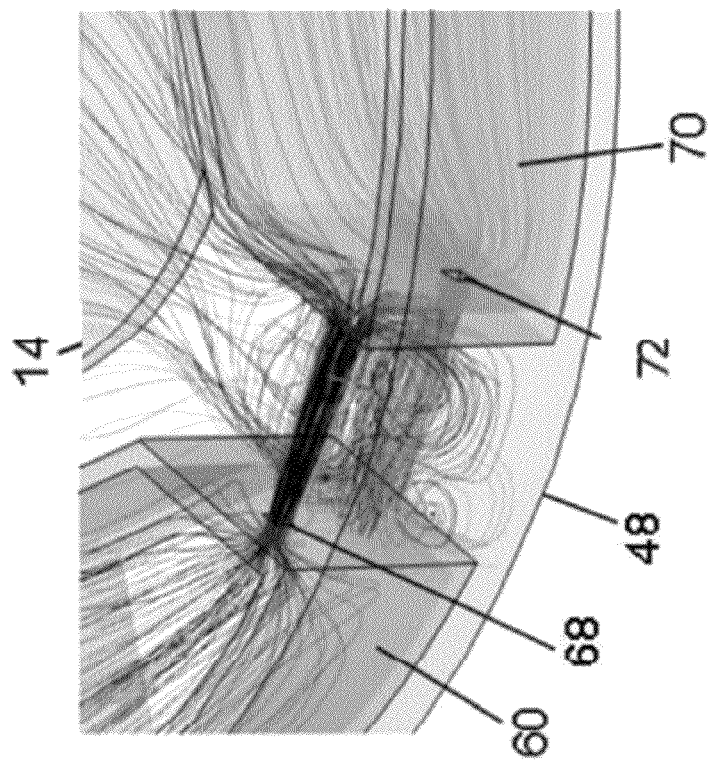
FIG. 14B is an enlarged view illustrating the neighborhood of the first and the second gas supply inlets in FIG. 14A.

FIG. 14A and FIG. 14B are schematic views of computed result of the flow of the gases in a reaction chamber configured the height of the first gas supply inlets are different from the height of the second gas supply inlets.

According to the this embodiment, as shown in FIG. 14A or FIG. 14B, since it becomes easy that a silicon-containing gas or a chlorine-containing gas supplied from the first gas supply inlets and a carbon-containing gas, a hydrogen gas as a reducing gas or a type-n dopant-containing gas supplied from the second gas supply inlets are swirling around the place between the first gas supply nozzles and second gas supply nozzles, therefore, mixture of these gases are promoted. By flowing the mixed gases to the wafer 14, the thickness of the silicon carbide films formed on the substrates are uniform and the concentrations of the type-n dopant to the silicon carbide films are uniform.

In addition, the reason why the height of the first gas supply inlets is different from the height of the second gas supply inlets is that preventing getting clogged with films generated the first gas or second gas supply nozzles 60, 70 or the particles caused by forming film. For example, if the height of the first gas supply inlets is same as the height of the second gas supply inlets, generating a silicon carbide film near the gas supply inlets may be expected by the reaction of the gases near the gas supply inlets.

In addition, as shown in FIG. 13C, it is preferable that the section of the gas supply nozzle may be a polygonal shape. By using cylindrical nozzles as shown in FIG. 13C, there may be spaces between the nozzles and the heating target object 48, source gases like a silicon-containing gas or a carbon-containing gas may leak into these spaces, so there may be fears about preventing enough mixtures of the gases. And there may be fears about forming silicon carbide films except the wafers 44 in a reaction chamber. These unexpected films may become the cause of particles.

As shown in FIG. 13C, the section of the gas supply nozzle may be a polygonal shape, but not limited to this polygonal shape. It is preferable that the shape of the gas supply nozzle may be that sidewall of the gas supply nozzle is disposed along the inner wall of the heating target object 48. For example, if the cross-sectional view of the heating target object 48 is a cylindrical shape, it is preferable that a part of the gas supply nozzle may be arced shape.

Since this structure may reduce that reaction gases are leaking into the spaces between the heating target object 48 and gases supply nozzles 60, 70, reaction gases supplied from the first and second gas supply inlets 68,72 are delivered to the wafers 40 efficiently after mixed them. Owing to this structure, forming films between the heating target object 48 and gases supply nozzles 60, 70 are prevented and the fears of generating particles caused the films may be reduced.

Figure 15:
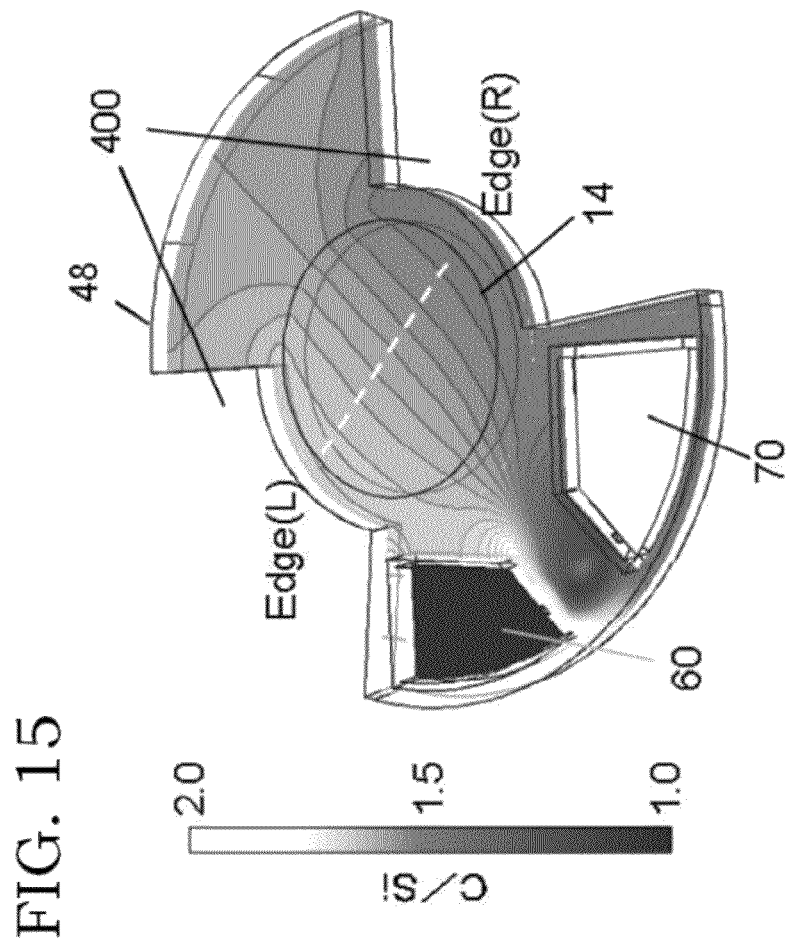
FIG. 15 is a distribution map of the film thickness on the substrate, wherein the film was formed in the reaction chamber according to the third embodiment of the present invention.

FIG. 15 shows a distribution map of C/Si ratio of the silicon carbide film, wherein the film was formed in the reaction chamber according to this embodiment. As shown in FIG. 15, the deviations of the C/Si ratios in the silicon carbide film formed wafers 14 are low. Therefore, doping is uniform when forming silicon carbide films.

Figure 16:
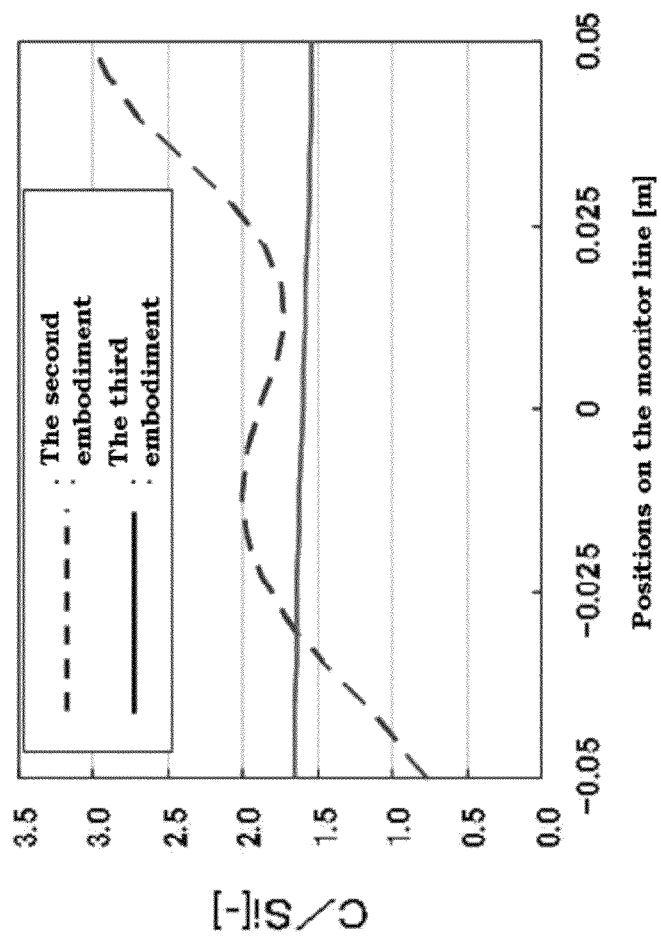
FIG. 16 is a graph illustrating a comparison of the distribution of the value of C/Si, detected by the film on the substrate at the monitor line, wherein the film was formed in the reaction chamber according to the second and the third embodiments of the present invention.

FIG. 16 is a graph illustrating a comparison of the distribution of the value of C/Si, detected by the film on the substrate at the monitor line, wherein the film was formed in the reaction chamber according to the second and the third embodiments of the present invention. As shown in FIG. 16, the C/Si ratios under the configuration of gas supply nozzles at the third embodiment are more uniform than the C/Si ratios under the configuration of gas supply nozzles at the second embodiment.

According to this embodiment, at least one of the following effects can be attained in addition to the effects explained in the first and second embodiments.

(1) According to arranging the first and second gas supply inlet at opposite positions, gases can be delivered to wafers 14 after mixing well.

(2) Owing to the effect (1), by configuring the height of the first gas supply inlets are different from the height of the second gas supply inlets, swirled gas flows can occur easily at the spaces between the first gas supply nozzles and second gas supply nozzles, so gases may be delivered to the wafers 14 after mixed them well at these spaces.

(3) Owing to the effect (2), as arranging the first and second gas supply inlets alternatively along the direction of stacked wafers 14, swirled gas flows can occur easily, so gases can be delivered to the wafer 14 after mixed them well.

(4) Owing to the effect (1), as the shape of the gas supply nozzle may be possible to dispose along the inner wall of the heating target object 48, gases leaked into the spaces between the heating target object 48 and gases supply nozzles 60, 70 can be reduced.

(5) Owing to the effect (4), the generating particles caused the films formed by the leaked reaction gases can be reduced.

A Fourth Embodiment

Next, a fourth embodiment of the present invention will be described.

In the fourth embodiment, the configuration of gas supply nozzles for efficiently supplying gases after mixing a silicon-containing gas supplied from the first gas supply nozzle and a carbon-containing gas supplied from the second gas supply nozzle are described.

As shown in FIG. 19, the first gas supply nozzle 60, extended to the direction of the stacked wafers 14 has at least a divergence nozzle having one or more the first gas supply inlets, arranged parallel to the surface of the wafers 14. A silicon-containing gas and a chlorine-containing gas may be supplied from the first gas supply inlet 68. The second gas supply nozzle 70, disposed the different position of the first gas supply nozzle 60, extended to the direction of the stacked wafers 14 has at least a divergence nozzle having one or more the second gas supply inlets, arranged parallel to the surface of the wafer 14. A carbon-containing gas, a nitrogen gas e.g. as a dopant-containing gas and a hydrogen gas as a reducing gas may be supplied from the second gas supply inlet 72. In this way, a silicon carbide file containing type-n dopant may be formed.

As shown in FIG. 19A, by supplying gases parallel to the wafers 14, the thickness of the silicon carbide films may be uniform and nitrogen atoms as dopant may doped uniformly.

Figure 19B:
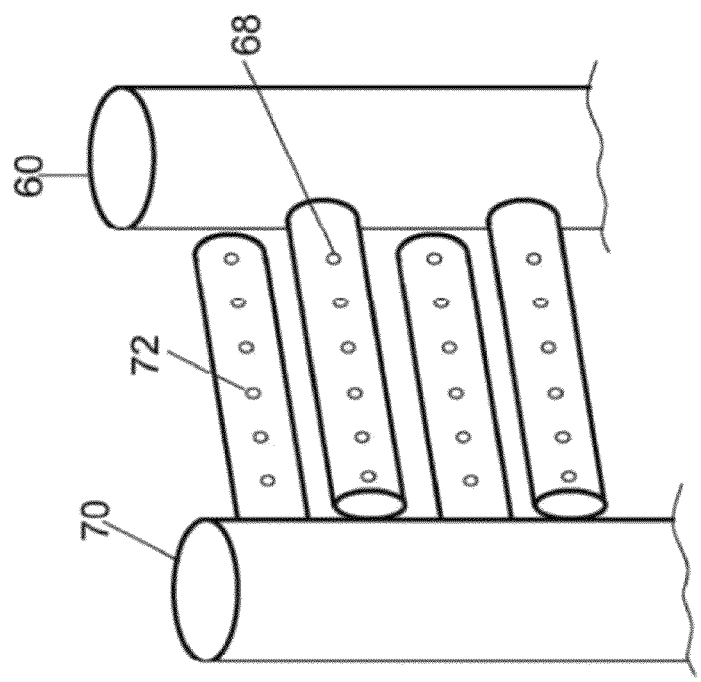
FIG. 19B is a perspective view illustrating gas supply nozzles having a divergence pipe.

In particular, by supplying gases through the first divergence nozzles or the second divergence nozzles as shown in FIG. 19B, the influence of the boat pillars 30a for supporting wafers 14 can be reduced. The wafers 14 supported by a plural of boat pillars 30a may be rotating for keeping the uniformity of film thickness. Then, the boat pillars 30a may pass the front of the gas supply inlets. In this timing, supplying gases may be prevented by the influence of boat pillars 30. By arranging a plural of gas supply inlets parallel to the surface of the wafer 14 as shown FIG. 19A, FIG. 19B or FIG. 19C, the gases can be supplied broadly or at high concentrations. Consequently, the influence of the boat pillars 30a may be reduced.

In addition, to further reduce the influence of the boat pillars 30a, installing wafers from the boat pillars 30 apart by using wafer holders 300 may be effective as shown in FIG. 19(c). The wafer holder 300 have a first annular holder 300a. A wafer 14 is held by the first annular holder 300a. In this way, the influence of the boat pillars 30a can be reduced because making the space between the wafer 14 and the boat pillars 30a corresponding to the width of a first annular holder 30a may be possible. In addition, this embodiment adopts so-called the face-down method. The top surface of wafer 14 is covered with a second holder 300b. Covering the top surface of wafer 14 may reduce the influence of particles falling from the upper space. By letting the second holder 300b come in contact with the top surface of wafer 14, forming films on the opposite surface of a wafer 14 may be reduced.

In addition, it may be preferable that the first divergence nozzles and the second divergence nozzles are disposed alternately. By these arrangements, silicon-containing gases or chlorine-containing gases supplied from the first gas supply nozzles and carbon-containing gases, nitrogen gases as type-n dopant-containing gases or hydrogen gases as reducing gases supplied from the second gas supply nozzles may be mixing uniformly, then the distributions of these gases' concentrations on the monitor line which lies for the flow of the gases perpendicularly can be uniform.

In addition, it may be preferable that pairs of the first divergence nozzle and the second divergence nozzle are disposed at the spaces between each of the wafer stacked to the height direction. By these arrangements, the supply condition of the gas for each wafer 14 can make equivalence, so the uniformity between the wafers 14 may be improved. Furthermore, it may be preferable that the film formation side of wafer 14 is arranged nearer to the first gas supply inlets 68 supplying a silicon-containing gas among the first gas supply inlets 68 and the second gas supply inlets 72. In the formation of the silicon carbide film containing dopant, the ratio of carbon atoms and silicon atoms (C/Si ratio) in the silicon carbide film may become important. In particular, when the concentration of carbon is high, the quality of film may be deteriorated. Therefore, it may be preferable that the first gas supply inlets 68 supplying a silicon-containing gas are disposed closer to the film formation side of wafer 14 than the second gas supply inlets 72 supplying a carbon-containing gas so that the ratio of the elemental ingredients in the silicon carbide file becomes silicon rich. Therefore, the first divergence nozzles and the second divergence nozzles are disposed in order of the first divergence nozzle, the second divergence nozzle from the place that is near to a wafer 14.

In the case of supplying gases from the first and second divergence nozzles which extended to the parallel direction to the wafers 14 like shown in FIG. 19, the C/Si ratio on the monitor line which lies for the flow of the gases perpendicularly in FIG. 19A can be uniform by controlling the spaces for mixing the gases delivered from the first and second divergence nozzles. Detailed explanations using the second monitor line which is perpendicular to the monitor line shown in FIG. 19A are as follows. At first, if starting supply of gases under the condition that the ratio of the gas containing silicon atoms and the gas containing carbon atoms (C/Si) may be 0.5, then the gas containing silicon atoms and the gas containing carbon atoms are completely mixing each other before carrying to the wafer 14, the C/Si ratio on the second monitor line should be 0.5 constantly without the consideration of consumption of the gases. However, in case with the consideration of consumption of the gases, the ratio of the gas containing silicon atoms and the gas containing carbon atoms of the part which is near to the gas supply nozzle may be different from the ratio of the far-off part from the gas supply nozzle because the gas containing silicon atoms and the gas containing carbon atoms may be used in the same rate. For example, if a silicon-containing gas with 100 quantities and a carbon containing gas with 50 quantities may be supplied, a silicon-containing gas and a carbon containing gas may be consumed in the same way as far from the gas supply inlets and the quantities of these gases may be decrease. It may be an extreme example, but, here, the carbon-containing gas will be consumed to 10 quantities if a silicon-containing gas was consumed to 60 quantities. C/Si ratio of this time becomes 10/60=0.17, and the C/Si ratio changes in the side that is near to a gas supply nozzle and a far-off side.

On the other hand, without completely mixing a silicon-containing gas and a carbon-containing gas before carrying these gases to the wafer 14, by controlling it to gradually mix a silicon-containing gas and a carbon-containing gas on the second monitor line, it may be possible that controlling the C/Si ratio with the side that is near to the gas supply nozzle and the far-off side may be uniform and concentrations of dopant may be uniform. These are described bellow.

At first, supplying two gases in parallel like this embodiment, two gases are mixed by diffusions of the gases respectively. Therefore, the diffusion of the gas supplied from the second divergence nozzle to the gas flow supplied from the first divergence nozzle which is near to the second monitor line may occur gradually. Therefore, the concentration of gas supplied from the second divergence nozzle on the second monitor line becomes higher according to the distance from the divergence nozzle being far, without the consideration about gas consumption on the way. On the other hand, to make C/Si ratio uniformly with the consideration about gas consumption, lowering a decrease in carbon-containing gas against a decrease in silicon-containing gas on the second monitor line may be preferable. Therefore, if the diffusion of gas supplied from the second divergence nozzle to the silicon-containing gas flow supplied from the first divergence nozzle may occur gradually, a carbon-containing gas will be gradually supplemented by the diffusion on the second monitor line. So lowering a decrease in carbon-containing gas may be possible against a decrease in silicon-containing gas.

The gas flow velocity supplying from the first gas supply inlet may be the velocity like the diffusion gradually while the gas supplied from the second gas inlets 72 flow on a film formation side of wafer 14 so as to diffuse gas supplied from the second gas nozzle gradually to the gas flow supplied from the first gas nozzle. Generally, when the gas flow velocity becomes high, it is likely hard to diffuse other gases to this gas, therefore controlling the gas flow velocity supplied from the first gas supply inlets 68 may be preferable. As a method to control the gas flow velocity supplied from the first gas supply inlets 68, for example, it may be preferable that the gas flow velocity of carrier gas for a silicon-containing gas may become high or lower size of the first gas supply inlet 68.

In addition, continuing a condition that a silicon-containing gas and a carbon-containing gas are not mixed before these gases reach wafers 14 may be further effective when the wafer holders 300 shown FIG. 19 (c) are using. In other words, a silicon carbide film will be formed on wafer holder 300 when a silicon-containing gas and a carbon-containing gas are mixed before these gases reach wafers 14. Forming a silicon carbide film shows that source gases have been consumed, therefore the use efficiency of the source gases worsen. On the other hand, when mixture may start on wafer 14, the consumption of the source gases do not occur because it is not formed a film on wafer holder 300. Therefore, the use efficiency of the source gases may be improved, in other words, a film formation rate may be improved and the productivity of silicon-carbide films may be improved.

In addition, the gas supply inlets are shaped like plural holes shown in FIG. 19, but not limited to this embodiment, a slit shaped inlet may be preferable.

According to this embodiment, at least one of the following effects can be attained in addition to the effects explained from the first embodiment to the third embodiment.

(1) According to arranging the first gas supply inlets and the second gas supply inlets to the height direction by using divergence nozzles disposed gas supply nozzles, the gases may be delivered to the wafer 14 after mixed them well.

(2) In addition to the effects described at (1), by arranging gas supply inlets thickly disposed divergence nozzles, the influence of the boat pillars can be reduced.

(3) In addition to the effects described at (1), by arranging gas supply inlets close to the film formation side of the wafer, a silicon carbide film containing dopant may be uniform.

(4) In addition to the effects described at (1), by shaping the gas supply nozzle so as to dispose according to an inner wall of the heating target object, flowing into the space between the nozzles and the heating target object can be prevented.

As described above, the present embodiments apply to the silicon carbide epitaxy. In addition, these embodiments also apply to the other epitaxial films or Chemical Vapor Deposition (CVD) films e.g.

(Supplementary Notes)

The present invention also includes the following embodiments.

(Supplementary Note 1)

According to an embodiment of the present invention, there is provided a method of manufacturing a semiconductor device by using a substrate processing apparatus comprising a reaction chamber configured to process a plurality of substrates stacked at predetermined intervals, a first gas supply nozzle having one or more first gas supply inlets in the reaction chamber and a second gas supply nozzle having one or more second gas supply inlets in the reaction chamber, wherein a primary first gas flow from the first gas supply inlets and a primary second gas flow from the second gas supply inlets are crossed with each other before these gas flows reach the substrates, the method comprising:

loading the plurality of substrates into the reaction chamber;

forming a silicon carbide film containing dopant on the substrates, wherein the step of forming a silicon carbide film containing dopant on the substrates is comprised of supplying at least silicon-containing gas and a chlorine-containing gas, or at least a gas containing silicon atoms and chlorine atoms from the first gas supply inlet into the reaction chamber, supplying at least a carbon-containing gas and a reducing gas from the second gas supply inlet into the reaction chamber and supplying a dopant-containing gas into the reaction chamber from the first gas supply inlet or the second gas supply inlet; and unloading the substrates from the reaction chamber.

(Supplementary Note 2)

According to another aspect of the present invention, there is provided a substrate processing apparatus, comprising:

a first gas supply system configured to supply at least a silicon-containing gas and a chlorine containing gas, or at least a gas containing silicon atoms and chlorine atoms to the reaction chamber;

a second gas supply system configured to supply at least carbon-containing gas and a reducing gas to the reaction chamber;

a third gas supply system configured to supply at least a dopant-containing gas to the reaction chamber;

a first gas supply nozzle having one or more first gas supply inlets for flowing gases to a space where a plurality of substrates are stacked, and installed to connect to the first gas supply system or connect to the first and the third gas supply system;

a second gas supply nozzle having one or more second gas supply inlets for flowing gases to a space where a plurality of substrates are stacked, and installed to connect to the second gas supply system or connect to the second and the third gas supply system, wherein a primary first gas flow from the first gas supply inlets and a primary second gas flow from the second gas supply inlets are crossed before these gas flows reach the substrates;

a controller, wherein the controller is configured to control:

the first gas supply system to supply at least a silicon-containing gas and a chlorine-containing gas, or at least a gas containing silicon atoms and chlorine atoms into the reaction chamber through the first gas supply inlet, the second gas supply system to supply at least a carbon-containing gas and a reducing gas into the reaction chamber through the second gas supply inlet, the third gas supply system to supply at least a dopant-containing gas into the reaction chamber from the first or second gas supply inlet,
so as to form a silicon carbide film containing dopant on the substrate.

(Supplementary Note 3)
According to another aspect of the present invention, there is provided a method of manufacturing a substrate by using a substrate processing apparatus comprising a reaction chamber configured to process a plurality of substrates stacked at predetermined intervals, a first gas supply nozzle having one or more first gas supply inlets in the reaction chamber and a second gas supply nozzle having one or more second gas supply inlets in the reaction chamber, wherein a primary first gas flow from the first gas supply inlets and a primary second gas flow from the second gas supply inlets are crossed with each other before these gas flows reach the substrates, a method is comprising:

loading the plurality of substrates into the reaction chamber, forming a silicon carbide film containing dopant on the substrate, wherein the step of forming a silicon carbide film containing dopant on the substrate is comprised of supplying at least a silicon-containing gas and a chlorine-containing gas, or at least a gas containing silicon atoms and chlorine atoms from the first gas supply inlet into the reaction chamber, supplying at least a carbon-containing gas and a reducing gas from the second gas supply inlet into the reaction chamber and supplying a dopant-containing gas into the reaction chamber from the first gas supply inlet or the second gas supply inlet; and unloading the substrates from the reaction chamber.

(Supplementary Note 4)
In the method of manufacturing a semiconductor device of Supplementary Note 1, a rare gas is further supplied through the first gas supply inlet.

(Supplementary Note 5)
In the method of manufacturing a semiconductor device of Supplementary Note 4, a rare gas is an argon gas.

(Supplementary Note 6)
In the method of manufacturing a semiconductor device of Supplementary Note 1,
the first and second gas supply nozzles have a curved shape according to an inner wall of the heating target object.

(Supplementary Note 7)
In the method of manufacturing a semiconductor device of Supplementary Note 6,
the first and second gas supply nozzles have a cylindrical shape.

(Supplementary Note 8)
In the method of manufacturing a semiconductor device of Supplementary Note 6,
the first and second gas supply nozzles have a polygonal shape.

(Supplementary Note 9)
In the method of manufacturing a semiconductor device of Supplementary Note 6,
the first and second gas supply nozzles have a shape of the arc in a part.

(Supplementary Note 10)
In the method of manufacturing a semiconductor device of Supplementary Note 1, the first gas supply inlet is disposed in a direction toward the second gas supply nozzle, and the second gas supply inlet is disposed in a direction toward the first gas supply nozzle.

(Supplementary Note 11)
In the method of manufacturing a semiconductor device of Supplementary Note 10, the first and second gas supply inlets are disposed at positions facing each other.

(Supplementary Note 12)
In the method of manufacturing a semiconductor device of Supplementary Note 10, the first and second gas supply inlets are disposed at different heights.

(Supplementary Note 13)
In the method of manufacturing a semiconductor device of Supplementary Note 10, the first and second gas supply inlets are spaced the same distance from a wafer in radial directions of the wafer, and the first and second gas supply inlets are disposed at different positions (heights) in a direction perpendicular to the wafer.

(Supplementary Note 14)
In the method of manufacturing a semiconductor device of Supplementary Note 1, the substrate processing apparatus of Supplementary Note 1 is further comprise a magnetic field generating unit installed outside the reaction chamber for electromagnetic induction heating.

(Supplementary Note 15)
In the method of manufacturing a semiconductor device of Supplementary Note 1, the substrate processing apparatus of Supplementary Note 1 is further comprising an insulator between a reaction tube and a heating target object constituting the reaction chamber.

(Supplementary Note 16)
In the method of manufacturing a semiconductor device of Supplementary Note 1, the substrate processing apparatus of Supplementary Note 1 is further comprising the first plural divergence nozzles disposed to the first gas supply nozzle and extended to the parallel direction to the surface of the substrate and the second plural divergence nozzles disposed to the second gas supply nozzle and extended to the parallel direction to the surface of the substrate, the first plural divergence nozzles and the second plural divergence nozzles are disposed to the stacked direction of the plural substrates.

DESCRIPTION OF SIGNS AND NUMERALS

10 Semiconductor manufacturing apparatus
12 Case
14 Wafer
16 Pod
30 Boat
40 Process furnace
42 Reaction tube
44 Reaction chamber
48 Heating target object
50 Induction coil
60 First gas supply nozzle
68 First gas supply inlet
70 Second gas supply nozzle
72 Second gas supply inlet
90 First exhaust outlet
150 Main control unit
152 Controller
360 Third gas supply inlet
390 Second gas exhaust outlet

The invention claimed is:
1. A method of manufacturing a semiconductor device by using a substrate processing apparatus comprising a reaction chamber configured to process a plurality of substrates stacked at predetermined intervals, a first gas supply nozzle having one or more first gas supply inlets in the reaction chamber and a second gas supply nozzle having one or more second gas supply inlets in the reaction chamber, wherein a first gas flow from the first gas supply inlets and a second gas flow from the second gas supply inlets are crossed with each other before these gas flows reach the substrates, the method comprising:

loading the plurality of substrates into the reaction chamber;

forming a silicon carbide film containing dopant on the substrates, wherein the step of forming a silicon carbide film containing dopant on the substrates is comprised of supplying at least a silicon-containing gas and a chlorine-containing gas, or at least a gas containing silicon atoms and chlorine atoms from the first gas supply inlet into the reaction chamber, supplying at least a carbon-containing gas and a reducing gas from the second gas supply inlet into the reaction chamber and supplying a dopant-containing gas with a source gas containing the atoms for replacement by dopant, into the reaction chamber from either the first gas supply inlet or the second gas supply inlet; and unloading the substrates from the reaction chamber.

2. A method of manufacturing a semiconductor device of claim 1, a rare gas is further supplied through the first gas supply inlet.

3. A method of manufacturing a semiconductor device of claim 2, an argon gas is further supplied through the first gas supply inlet.

4. A method of manufacturing a semiconductor device of claim 1, the first and second gas supply nozzles have a curved shape according to an inner wall of the heating target object.

5. A method of manufacturing a semiconductor device of claim 4, the first and second gas supply nozzles have a cylindrical shape.

6. A method of manufacturing a semiconductor device of claim 4, the first and second gas supply nozzles have a polygonal shape.

7. A method of manufacturing a semiconductor device of claim 4, the first and second gas supply nozzles have a shape of the arc in a part.

8. A method of manufacturing a semiconductor device of claim 1, the first gas supply inlet is disposed in a direction toward the second gas supply nozzle, and the second gas supply inlet is disposed in a direction toward the first gas supply nozzle.

9. A method of manufacturing a semiconductor device of claim 8, the first and second gas supply inlets are disposed at positions facing each other.

10. A method of manufacturing a semiconductor device of claim 8, the first and second gas supply inlets are disposed at different heights.

11. A method of manufacturing a semiconductor device of claim 8, the first and second gas supply inlets are spaced the same distance from a wafer in radial directions of the wafer, and the first and second gas supply inlets are disposed at different positions (heights) in a direction perpendicular to the wafer.

12. A method of manufacturing a semiconductor device of claim 1, the substrate processing apparatus further comprising a magnetic field generating unit installed outside the reaction chamber for electromagnetic induction heating.

13. A method of manufacturing a semiconductor device of claim 1, the substrate processing apparatus is further comprising an insulator between a reaction tube and a heating target object constituting the reaction chamber.

14. A method of manufacturing a semiconductor device of claim 1, the substrate processing apparatus is further comprising the first plural divergence nozzles disposed to the first gas supply nozzle and extended to the parallel direction to the surface of the substrate and the second plural divergence nozzles disposed to the second gas supply nozzle and extended to the parallel direction to the surface of the substrate, the first plural divergence nozzles and the second plural divergence nozzles are disposed to the stacked direction of the plural substrates.

15. A method of manufacturing a semiconductor device of claim 1, supplying the dopant-containing gas into the reaction chamber from the first gas supply inlet, when the dopant is type-p dopant, and supplying the dopant-containing gas into the reaction chamber from the second gas supply inlet, when the dopant is type-n dopant.

16. A method of manufacturing a substrate by using a substrate processing apparatus comprising a reaction chamber configured to process a plurality of substrates stacked at predetermined intervals, a first gas supply nozzle having one or more first gas supply inlets in the reaction chamber and a second gas supply nozzle having one or more second gas supply inlets in the reaction chamber, wherein a first gas flow from the first gas supply inlets and a second gas flow from the second gas supply inlets are crossed with each other before these gas flows reach the substrates, the method comprising:

loading the plurality of substrates into the reaction chamber;

forming a silicon carbide film containing dopant on the substrates, wherein the step of forming a silicon carbide film containing dopant on the substrates is comprised of supplying at least a silicon-containing gas and a chlorine-containing gas, or at least a gas containing silicon atoms and chlorine atoms from the first gas supply inlet into the reaction chamber, supplying at least a carbon-containing gas and a reducing gas from the second gas supply inlet into the reaction chamber and supplying a dopant-containing gas with a source gas containing the atoms for replacement by dopant, into the reaction chamber from either the first gas supply inlet or the second gas supply inlet; and unloading the substrates from the reaction chamber.

* * * * *